(12) United States Patent
Hidaka

(10) Patent No.: US 6,469,923 B1
(45) Date of Patent: Oct. 22, 2002

(54) SEMICONDUCTOR DEVICE WITH PROGRAMMING CAPACITANCE ELEMENT

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 22 days.

(21) Appl. No.: 09/629,860

(22) Filed: Aug. 1, 2000

Related U.S. Application Data

(63) Continuation of application No. 09/272,770, filed on Mar. 19, 1999, now Pat. No. 6,115,283.

(30) Foreign Application Priority Data

Oct. 19, 1998 (JP) ............................................ 10-297057

(51) Int. Cl.[7] .............................................. G11C 11/24
(52) U.S. Cl. ...................................... 365/149; 365/200
(58) Field of Search ................................ 365/149, 200, 365/189.09; 438/210

(56) References Cited

U.S. PATENT DOCUMENTS

| | | | |
|---|---|---|---|
| 5,110,754 A | 5/1992 | Lowrey et al. ................ 437/52 |
| 5,334,880 A | 8/1994 | Abadeer et al. ............. 307/219 |
| 5,631,862 A | 5/1997 | Cutter et al. ................... 365/96 |
| 5,652,725 A | 7/1997 | Suma et al. ................. 365/200 |
| 5,750,426 A | * 5/1998 | Rajkanan et al. ............ 438/210 |
| 5,825,696 A | * 10/1998 | Hidaka et al. ......... 365/189.09 |
| 5,896,041 A | 4/1999 | Sher et al. ..................... 326/38 |
| 6,115,283 A | * 9/2000 | Hidaka ......................... 365/149 |
| 6,229,227 B1 | * 5/2001 | Muthukumaraswamy et al. ................................................... 307/38 |

OTHER PUBLICATIONS

"Ultra LSI Memory" by K. Ito, Published by Baifukan, pp. 181–183.

* cited by examiner

Primary Examiner—David Nelms
Assistant Examiner—M. Tran
(74) Attorney, Agent, or Firm—McDermott, Will & Emery

(57) ABSTRACT

In order to implement a capacitor-type anti-fuse having desired breakdown voltage characteristics and efficiently and reliably set in a blown state while reliably holding program information in a normal operation mode, capacitance elements having the same structure as memory cell capacitors are arranged alignedly along a row or column direction and coupled in parallel with each other for implementing a capacitor-type anti-fuse. The memory cell pattern is repeated also in a peripheral circuit region, whereby capacitance elements having a complete structure can be implemented to implement a capacitor-type anti-fuse correctly having desired characteristics.

14 Claims, 17 Drawing Sheets

(INCLUDING CAPACTOR-TYPE ANTI-FUSE)

↕ IDENTICAL ROW-DIRECTIONAL ARRANGEMENT PATTERN, IDENTICAL CAPACITOR STRUCTURE

: REPETITIVE PATTERN IDENTICAL TO COLUMN-DIRECTIONAL ARRANGEMENT PATTERN OF MEMORY ARRAY

FUSE BLOW

FUSE NON-BLOW

: PROGRAMMING OPERATION

: NORMAL MODE

SEMICONDUCTOR DEVICE WITH PROGRAMMING CAPACITANCE ELEMENT

This application is a continuation of application Ser. No. 09/272,770 filed Mar. 19, 1999, now U.S. Pat. No. 6,115,283.

BACKGROUND OF THE INVENTION

1. Field of the Invention

The present invention relates to a semiconductor device, and more particularly, it relates to a semiconductor device utilizing a capacitor as a programming element. More specifically, the present invention relates to the structure of a programming circuit in a dynamic semiconductor memory device including a memory cell having a capacitor.

2. Description of the Background Art

In a semiconductor device, programming circuits are employed for various applications. In a semiconductor memory device, for example, programming circuitry is employed for setting operation modes such as a fast page mode and an EDO (extended data output) mode, setting a word structure (×8 or ×16) and the like in a DRAM (dynamic random access memory). In order to finely adjust a resistance value for generating a reference voltage, a fusible link element is employed as the programming element.

In the semiconductor memory device, a defective address programming circuit for storing a defective address is employed in order to repair a defective memory cell. When a defective address is designated, an addressed normal memory cell is replaced with a redundant memory cell.

In such a programming circuit, a fusible link element (fuse element) is generally employed. An energy beam such as a laser beam is employed for programming (blowing/non-blowing) the fuse element. When such a fuse element is employed, a post-step of cleaning or the like is necessary for preventing blown fragments from scattering around the portion irradiated with the energy beam after blowing (laser blowing), resulting in a relatively long time for the program.

When fuse elements are arranged in high density in a high density/highly integrated semiconductor device, an adjacent fuse element is partially damaged due to misalignment of the laser beam, to cause difficulty in correct programming.

Further, the fuse elements to be blown are incompletely blown due to misalignment of the laser beam, to result in incorrect programming.

When the fuse elements are defective address programming elements for repairing defective memory cells, the number of the fuse elements to be blown is increased to result in a high possibility of erroneous programming. Such erroneous programming reduces the yield of the products.

In addition to the aforementioned fusible link elements, programming elements include an element called an anti-fuse. In this anti-fuse, a capacitor insulation film is subject to dielectric breakdown depending on information to be stored, for performing programming in accordance with conduction/non-conduction of the capacitor.

FIG. 35 schematically illustrates the structure of a conventional anti-fuse circuit. Referring to FIG. 35, the anti-fuse circuit includes a programmable capacitor (anti-fuse) 900 having an electrode node coupled to a node 902, a decoupling transistor 903 coupling a second electrode node of the programmable capacitor 900 to a node 904, an invertor 906 determining the program state of the programmable capacitor (hereinafter simply referred to as anti-fuse) 900 in accordance with the signal potential on the node 904 and outputting a signal FR indicating the result of the determination, a p-channel MOS transistor 908 charging the node 904 to the level of a power supply voltage Vcc in response to a trigger signal ZT, and n-channel MOS transistors 910 and 912 serially connected between the node 904 and a ground node. MOS transistor 910 receives a program signal AD at its gate, while MOS transistor 912 receives the signal FR outputted from invertor 906 at its gate.

The anti-fuse circuit further includes a p-channel MOS transistor 914 charging the node 904 to the level of the power supply voltage Vcc in accordance with the output signal FR from the invertor 906 and an n-channel MOS transistor 916 discharging the node 904 to the level of a ground voltage in accordance with a reset signal RST.

A high voltage (e.g., 12 V) is applied to the node 902 in a program mode, while the ground voltage is applied thereto in a normal operation mode (in a determination mode and in a standby state). MOS transistor 903 receives the power supply voltage Vcc on its gate and prevents the high voltage applied to the node 902 from being applied to the remaining circuit elements in programming of the anti-fuse 900. Operations of the anti-fuse circuit shown in FIG. 35 are now briefly described.

A programming operation for the anti-fuse 900 is described with reference to FIG. 36A. In the programming operation mode, the trigger signal ZT is set high and the MOS transistor 908 is held in a non-conductive state. The signal AD is set at a prescribed voltage level in accordance with programming information. Referring to FIG. 36A, the signal AD is set high in order to put (blow) the anti-fuse 900 in a conductive state. In an initial state, the node 904 is precharged to a high level and the signal FR from the invertor 906 is set low due to initialization of the trigger signal ZT. In response to the low-level signal FR, MOS transistor 914 is rendered conductive and the node 904 is held at a low level.

In the programming operation mode, the reset signal RST is set high and the MOS transistor 916 is rendered conductive. The node 904 is discharged to the ground voltage level and the signal FR rises to a high level. In response to the rise of the signal FR, MOS transistor 914 is rendered non-conductive while MOS transistor 912 is rendered conductive, and the node 904 is coupled to the ground node through the MOS transistors 910 and 912. While the reset signal RST is at the high level, the level of the voltage supplied to the node 902 is increased. Since the reset signal RST is at the high level, an increase of the voltage level of the node 904 due to capacitive coupling of the anti-fuse 900 is prevented when the voltage for the node 902 is raised, and the signal FR maintains the high level.

When the reset signal RST is set low, a high voltage for programming is applied to the node 902. A high voltage is applied across the anti-fuse 900 due to the voltage of the node 902, to cause a dielectric breakdown of a capacitor insulation film (the signal AD is at a high level). The voltage applied to the node 902 is transmitted to the node 904 to increase the voltage level thereat due to the dielectric breakdown of the anti-fuse 900. The voltage of the node 904 is determined by the ratio of the resistance of the anti-fuse 900 to the combined channel resistance of the transistors 910 and 912. When the voltage of the node 904 exceeds the input logic threshold voltage of the invertor 906, the signal FR lowers from the high level to a low level, the MOS transistor 912 is rendered non-conductive and the MOS transistor 914 is rendered conductive. The node 904 is charged to the level of the power supply voltage Vcc through the MOS. transistor 914. The decoupling transistor 903 transmits a voltage Vcc−Vth, where Vth represents the threshold voltage of the decoupling transistor 903. Thus, the flow of a current from the node 902 to the node 904 through the anti-fuse 900 is cut off to complete the programming of the anti-fuse 900.

When the signal AD is set low in the programming operation mode, the MOS transistor 910 is held in a non-conductive state. When the node 904 is discharged to the ground voltage level through the MOS transistor 916 by the reset signal RST, the signal FR rises to a high level for driving the MOS transistor 914 to a non-conductive state. When the reset signal RST falls to a low level, therefore, all MOS transistors 908, 910, 914 and 916 are rendered non-conductive and hence the node 904 enters a floating state. When a high voltage for programming is applied to the node 902 in this state, the high voltage for programming is transmitted from the node 902 to the node 904 through the MOS transistor 903 by capacitive coupling though the anti-fuse 900. Thus, no high voltage is applied between the electrodes of the anti-fuse 900 and hence no dielectric breakdown is caused in the anti-fuse 900. In the non-blown state of the anti-fuse 900, the voltage level of the node 904 is increased due to the capacitive coupling of the anti-fuse 900, the signal FR from the invertor 906 falls to a low level as shown by the broken line, the MOS transistor 914 is rendered conductive, and the node 904 is charged to the level of the power supply voltage Vcc.

A stored information read operation is now described with reference to FIG. 36B.

When the trigger signal ZT is inactive, the reset signal RST is driven to a high level and the node 904 is discharged to the ground voltage level. The signal FR from the invertor 906 is responsively driven to a high level.

In the stored information read mode, the ground voltage is applied to the node 902 and the signal AD is set low.

When the trigger signal ZT falls to a low level in this state, the MOS transistor 908 is rendered conductive. When the anti-fuse 900 is in a conductive state, the current from the MOS transistor 908 is discharged to the node 902 through the anti-fuse 900, and the node 904 maintains a low level and the signal FR maintains the high level.

If the anti-fuse 900 is programmed in a non-blown state, the node 904 is charged to the level of the power supply voltage Vcc and the signal FR responsively falls to a low level when the MOS transistor 908 is rendered conductive. The information stored in the anti-fuse circuit is read based on the high or low level of the signal FR.

When the anti-fuse circuit is employed for specifying an operation mode, the signal FR is utilized as an operation mode specifying signal.

When the anti-fuse circuit is employed as a defective address programming circuit for repairing a defective memory cell, the signal FR corresponds to a defective address bit and a supplied address signal and the signals FR are compared with each other bit by bit, for determining whether or not any defective address is specified in accordance with the result of the comparison. A defective cell is replaced with a redundant cell or a normal cell is accessed on the basis of the result of the determination.

The aforementioned anti-fuse circuit, which is electrically programmable and does not require a laser beam or the like, is widely employed as a programming circuit for a high density/highly integrated semiconductor device.

The aforementioned anti-fuse circuit employs a capacitor. In order to program the capacitor, a relatively high voltage (e.g., 12 V) must be applied for causing dielectric breakdown. In order to apply the high voltage, it is necessary to sufficiently increase the breakdown voltage of a MOS transistor (insulated gate field effect transistor) forming a program control circuit for applying the high voltage. In a recent high-density/highly integrated semiconductor memory device, however, the MOS transistor is reduced in size as well as breakdown voltage. In order to apply a high voltage for programming, therefore, a MOS transistor having a higher breakdown voltage than in other peripheral circuits must be employed as a component, and hence the size thereof is increased (when a MOS transistor is formed along a scaling rule and a gate insulation film is increased in thickness, the size is proportionately increased in general). Thus, the area occupied by the program control circuit is disadvantageously increased.

U.S Pat. No. 5,110,754 discloses a structure employing a capacitor having the same structure as a three-dimensional capacitor of a DRAM cell as an anti-fuse in order to program a capacitor anti-fuse with no utilization of a high voltage for programming. In this prior art, a single capacitor is employed as an anti-fuse. When a single capacitor having the same characteristics as a memory cell capacitor is formed in a peripheral circuit region, however, no repetitive pattern in a memory cell array region is formed and hence the capacitor formed on the peripheral region is different in pattern and shape from the memory cell capacitor, to result in such a problem that it is difficult to form a capacitor for an anti-fuse having the same characteristics as the memory cell capacitor.

In order to read program information, a relatively large current must be fed through the anti-fuse (capacitor), and its electrode area must be sufficiently increased (for reading stored data at a high speed). Thus, the area occupied by the anti-fuse circuit is also disadvantageously increased, to impede a high integration.

SUMMARY OF THE INVENTION

An object of the present invention is to provide a highly reliable anti-fuse circuit occupying a small area.

Another object of the present invention is to provide a semiconductor device capable of utilizing a capacitor correctly having the same characteristics as a memory cell capacitor as an anti-fuse element.

Briefly stated, a semiconductor device according to a first aspect of the present invention includes capacitors, which are identical in pattern and structure to memory cell capacitors of a memory cell array, aligned along rows or columns and connected in parallel with each other for forming a single capacitor to be employed as an anti-fuse.

The semiconductor device according to the first aspect of the present invention includes a plurality of memory cells arranged in rows and columns, and each having a capacitor for storing information, a programming element having a plurality of capacitance elements aligned at least unidirectionally along the rows or columns, identical in structure to the memory cell capacitors and coupled in parallel with each other, and a program control circuit for programming the programming element by dielectric breaking down of the plurality of capacitance elements.

A semiconductor device according to a second aspect of the present invention includes a MOS capacitor formed by an insulated gate field effect transistor having a gate, and first and second impurity regions formed spacedly on a surface of a semiconductor substrate region with a space and connected with each other. The gate of the MOS capacitor is electrically connected to a conductive line through a contact hole formed on a channel region between the first and second impurity regions, the first and second impurity regions are coupled together to form a first electrode of the capacitor, and the conductive line forms a second electrode of the capacitor.

The semiconductor device according to the second aspect of the present invention further includes a program control circuit for applying a programming voltage between the first and second electrodes in a programming operation mode.

A semiconductor device according to a third aspect of the present invention includes a plurality of memory cells each having a capacitor for storing information, a programming element having a first programming capacitance element including a capacitance element having the same structure as the memory cell capacitor and a second programming capacitance element including a capacitance element having the same structure as the memory cell capacitor, and a program control circuit for serially connecting the first and second programming capacitance elements between first and second electrodes of the programming element in a normal operation mode while connecting the first and second programming capacitance elements in parallel between the first and second electrodes in a programming operation mode.

A semiconductor device according to a fourth aspect of the present invention includes a programming capacitance element having first and second electrode nodes and having high breakdown voltage and a low breakdown voltage depending on the polarity of a voltage applied between the first and second electrode nodes, and a program control circuit for applying a programming voltage to the programming capacitance element with voltage polarity providing the high breakdown voltage for programming the programming capacitance element in a programming operation node while applying a voltage to the programming capacitance element with voltage polarity providing the low breakdown voltage in a normal operation mode.

A semiconductor device according to a fifth aspect of the present invention includes a programming capacitance element having first and second electrode nodes and having a high breakdown voltage and a low breakdown voltage depending on the polarity of a voltage applied between the first and second electrode nodes, and a program control circuit for applying a programming voltage between the first and second electrode nodes with voltage polarity for the low breakdown voltage in a programming operation mode while applying a voltage between the first and second electrode nodes with voltage polarity for the low breakdown voltage in a normal operation mode.

A semiconductor device according to a sixth aspect of the present invention includes a programming capacitance element having first and second electrode nodes and having a high breakdown voltage and a low breakdown voltage depending on the polarity of a voltage applied between the first and second electrode nodes, and a program control circuit for applying a voltage between the first and second electrode nodes with the same voltage polarity in a programming operation node and a normal operation mode.

A semiconductor device according to a seventh aspect of the present invention includes a capacitor and a control circuit for applying a programming voltage to the capacitor to selectively cause dielectric breakdown in the capacitor in accordance with stored information in a programming operation mode while applying a one-shot pulse signal between capacitor electrodes in response to a state determination instruction signal for determining information stored in the capacitor in a determination mode.

A semiconductor device according to an eighth aspect of the present invention includes a plurality normal elements, a plurality of programming circuits each programmed of information for specifying a defective normal element by dielectric breakdown of a capacitor, and a plurality of redundant elements arranged in correspondence to a plurality of programming circuits and for replacing and repairing a defective normal element among the plurality of normal elements. The plurality of programming circuits and the plurality of redundant elements can repair a defective programming circuit and/or a defective normal element.

A plurality of capacitance elements identical in structure to memory cell capacitors are arranged in the same pattern as the memory cell capacitors. Also in a peripheral circuit region, therefore, the capacitance elements can be arranged and formed in the same pattern as the memory cell capacitors in a memory cell array, readily implementing capacitance elements having the same structure and characteristics as the memory cell capacitors. The memory cell capacitors are capacitance elements having excellent area utilization efficiency, and a programming element having a large capacitance value can be implemented with a small area.

In general, a memory cell capacitor has a breakdown voltage of half a power supply voltage, and dielectric breakdown can be caused with a low voltage by utilizing a capacitance element having the same structure as the memory cell capacitor as a programming capacitor (capacitor anti-fuse) while a low voltage can be employed as a high voltage for programming.

Further, dielectric breakdown can be reliably caused in a programming operation mode and a conductive/non-conductive (blown/non-blown) state can be reliably held in a normal operation mode by setting the polarity of the high voltage for programming and a voltage applied in the normal operation mode depending on the directionality of the breakdown voltage of the capacitor, implementing a highly reliable anti-fuse circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Overall Structure]

Figure 1:
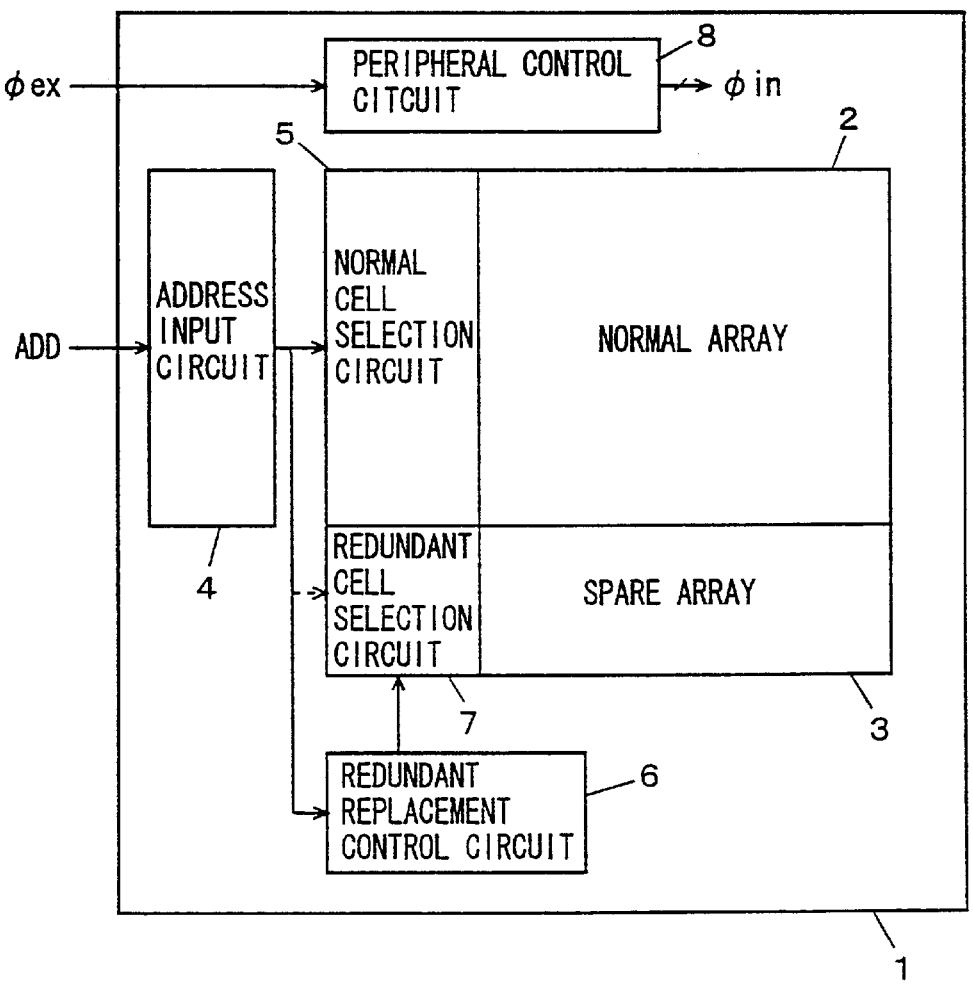
FIG. 1 schematically illustrates the overall structure of a semiconductor device according to the present invention.

FIG. 1 schematically illustrates the overall structure of a semiconductor device according to the present invention. This FIG. 1 shows a dynamic semiconductor memory device 1 as the semiconductor device to which the present invention is applied.

Referring to FIG. 1, the semiconductor memory device 1 includes a normal array 2 having a plurality of normal cells arranged in rows and columns, a spare array 3 having redundant cells arranged in rows and columns for repairing a defective normal cell in the normal array 2, an address input circuit 4 for receiving an external address signal ADD to generate an internal address signal, a normal cell selection circuit 5 for selecting an addressed normal cell of the normal array 2 in accordance with the internal address signal from the address input circuit 4 when activated, a redundant replacement control circuit 6 for determining whether or not the internal address signal from the address input circuit 4 specifies a defective normal cell of the normal array 2, a redundant cell selection circuit 7 for selecting a spare cell of the spare array 3 in accordance with a defective normal cell specification instruction signal from the redundant replacement control circuit 6, and a peripheral control circuit 8 for generating an internal control signal φin in accordance with an external control signal φex.

In the normal array 2 and the spare array 3, one-transistor/one-capacitor type memory cells are arranged in rows and columns. The spare array 3 is only required to have a structure for repairing a defective normal cell of the normal array 2. The spare array 3 includes a spare row for repairing a defective normal cell row of the normal array 2 and a spare column for repairing a normal cell column of the array 2. The normal cell selection circuit 5 includes a row selection circuit for selecting a normal cell row of the normal array 2 and a column selection circuit for selecting a normal cell column of the array 2. The redundant cell selection circuit 7 also includes a row selection circuit for selecting a redundant cell row of the spare array 3 and a column selection circuit for selecting a redundant cell column of the array 3. Alternatively, the redundant cell selection circuit 7 may include only either the row selection circuit for selecting a redundant cell row or the column selection circuit for selecting a redundant cell column.

When the internal address signal from the address input circuit 4 specifies a defective normal cell, the redundant replacement control circuit 6 inactivates the normal cell selection circuit 5 and activates the redundant cell selection circuit 7. The redundant replacement control circuit 6 may be configured such that a programming circuit for programming a defective normal cell row/column is provided therein and a row/column selection circuit is provided in the redundant cell selection circuit 7 in correspondence to each programming circuit. Further, the redundant cell selection circuit 7 may be activated in accordance with the defective normal cell specification instruction signal from the redundant replacement control circuit 6 for decoding the address signal from the address input circuit 4.

Figure 2:
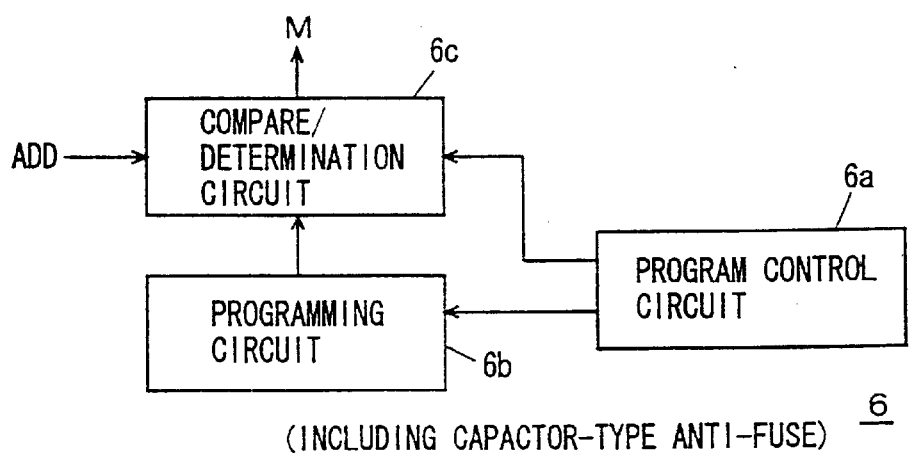
FIG. 2 schematically illustrates the internal structure of a redundant replacement control circuit shown in FIG. 1.

FIG. 2 schematically illustrates the structure of the redundant replacement control circuit 6 shown in FIG. 1. Referring to FIG. 2, the redundant replacement control circuit 6 includes a program control circuit 6a for generating a control signal specifying a normal operation mode and a programming operation mode, a programming circuit 6b for programming a defective normal cell address and reading program data in accordance with the control signal from the program control circuit 6a, and a compare/determination circuit 6c operating under control by the program control circuit 6a for comparing a programmed defective normal cell address signal from the programming circuit 6b with an internal address signal ADD from the address input circuit 4 to generate a signal M indicating whether or not redundant replacement (operation of replacing a defective normal cell with a redundant cell) has to be done in accordance with the result of the comparison.

The programming circuit 6b preferably includes a capacitor-type anti-fuse formed by a plurality of capacitance elements having the same structure as the memory cell capacitors and arranged in the same pattern as that of the arrangement of the memory cells in the normal array 2 and the spare array 3, as a programming element for programming a defective normal cell address.

[Embodiment 1]

Figure 3:
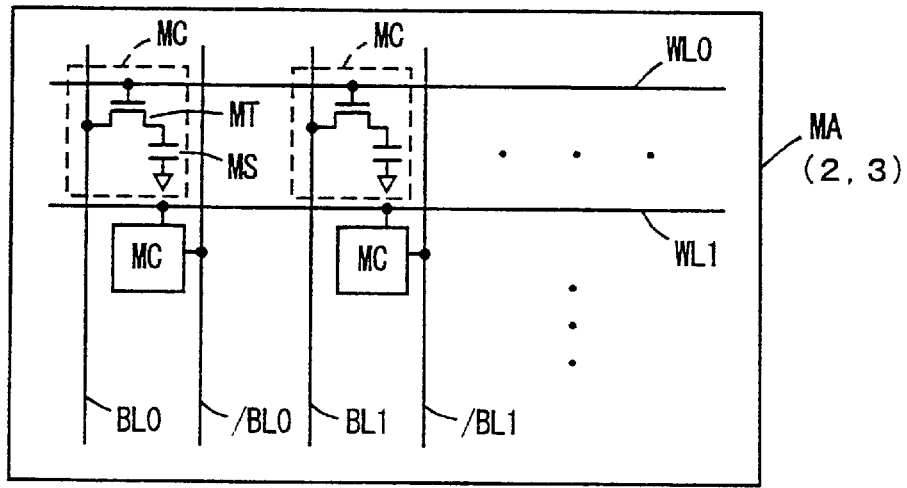
FIG. 3 illustrates the structure of a programming circuit included in a semiconductor memory device according to an embodiment 1 of the present invention.
Figure 3:
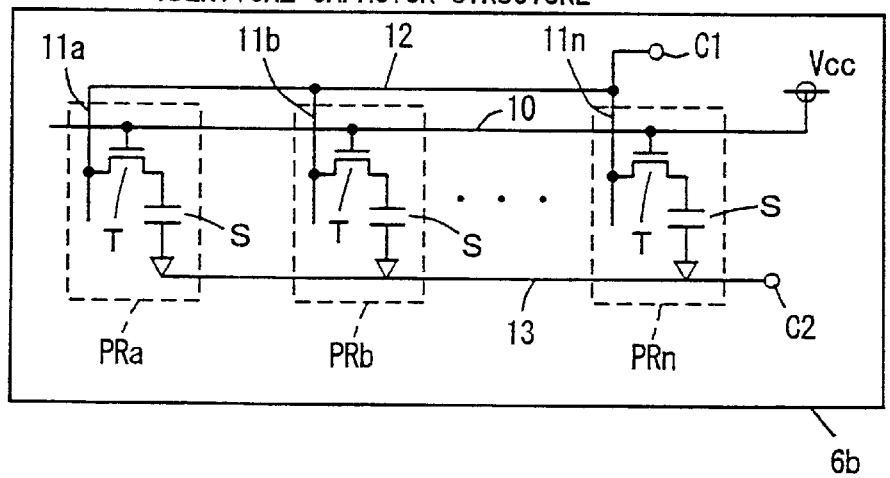

FIG. 3 illustrates the structure of a main part of a semiconductor memory device according to an embodiment 1 of the present invention. This FIG. 1 shows the structures of a memory array MA and a programming circuit 6b corresponding to a 1-bit address signal. The memory array MA may correspond to any of the normal array 2 and the spare array 3 shown FIG. 1. In each of the normal array 2 and the spare array 3, memory cells of the same pattern are repetitively arranged.

The memory array MA includes a plurality of memory cells MC arranged in rows and columns, word lines WL0, WL1, . . . arranged in correspondence to the memory cell rows, and pairs of bit lines BL0, /BL0, BL1, /BL1, . . . arranged in correspondence to the memory cell columns respectively. Each memory cell MC includes a capacitor MS for storing information and an access transistor MT formed by an n-channel MOS transistor for connecting the memory cell capacitor MS to a corresponding bit line in accordance with the signal potential on a corresponding word line.

The programming circuit 6b includes a plurality of program unit elements PRa to PRn aligned along the row direction. Each of the program unit elements PRa to PRn, has the same structure as the memory cell MC, and includes a capacitance element S and a MOS transistor T. The capacitance element S has the same structure as the memory cell capacitor MS, and the MOS transistor T has the same structure as the access transistor MT. The wording "the same structure" means that structure is the same in size and form. Thus, the capacitance element S has the same electric characteristics as the memory cell capacitor MS.

The programming circuit 6b further includes a conductive line 10 extending along the row direction to be connected to the gates of the MOS transistors T in common, a conductive line 13 connected to first electrode nodes of the capacitance elements S in common, conductive lines 11a to 11n connected to first electrode nodes of the MOS transistors T respectively, and a conductive line 12 connected to the conductive lines 11a to 11n in common. The conductive line 10 is formed in the same step and of the same material as the word lines WL (WL0, WL1, . . . ) in the memory cell array MA, for transmitting a power supply voltage Vcc. The conductive line 13 corresponds to a cell plate electrode layer for the memory cell capacitors MS in the memory array MA, and is formed in the same step as the cell plate electrode layer. The conductive lines 11a to 11n correspond to the bit lines BL (or /BL) in the memory array MA The conductive line 12 forms a first electrode node C1 of a programming element (capacitor-type anti-fuse), and the conductive line 13 forms a second electrode node C2 of the programming element.

The conductive line 10 transmits the power supply voltage Vcc, the MOS transistors T are rendered conductive, and the capacitance elements S are coupled to the conductive line 12 through the conductive lines 11a to 11n respectively. Thus, the plurality of capacitance elements S are connected in parallel between the electrode nodes C1 and C2 of the programming element, and a programming element can be implemented in a small occupied area with a relatively large capacitance value. In particular, a memory cell capacitor must have the minimum necessary capacitance value for storing information even if its area is reduced. Therefore, the memory cell capacitor has the most excellent area utilization efficiency. A programming element formed by capacitors having excellent area utilization efficiency can be implemented by connecting a plurality of capacitance elements having the same structure as the memory cell capacitor in parallel with each other.

Figure 4:
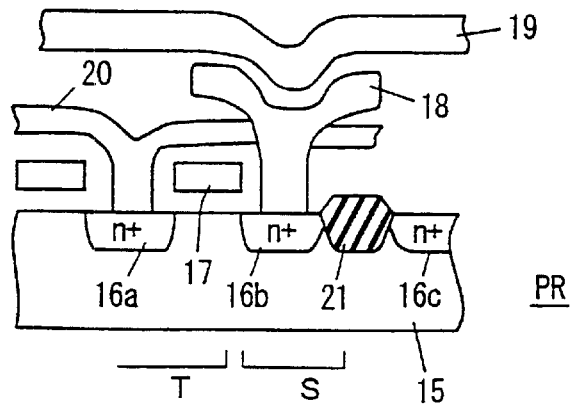
FIG. 4 schematically illustrates the internal structure of the programming circuit shown in FIG. 3.

FIG. 4 schematically illustrates a cross sectional structure of the memory cell MC or the program unit element PR (PRa to PRn). This FIG. 4 shows the cross sectional structure of the program unit element PR having the same structure as the memory cell MC. Referring to FIG. 4, the program unit element PR includes n-type impurity regions 16a, 16b and 16c formed spacedly on a surface of a semiconductor substrate region 15, a conductor layer 17 formed on a channel region between the impurity regions 16a and 16b with a gate insulation film (not shown) underlaid, a conductor layer 18 formed to be electrically connected to the impurity region 16b and to extend on the conductor layer 17, a conductor layer 19 arranged over a thin capacitor insulation film (not shown), and a conductor layer 20 electrically connected to the impurity region 16a and formed, under the conductor layer 18, to extend in a direction intersecting with the conductor layer 17.

The conductor layer 17 corresponds to the conductive line 10 shown in FIG. 3, the conductor layer 19 corresponds to the conductive line 13, and the conductor layer 20 corresponds to the conductive line 11 (11a to 11n). A thick isolation film 21 for element isolation is formed between the impurity regions 16b and 16c.

The program unit element PR has a three-dimensional structure, and the capacitance element S has a so-called stacked capacitor structure. When solely forming a capacitor having such a three-dimensional structure in a peripheral circuit region, such capacitance element has a pattern or step different from that of the peripheral circuit region since such a three-dimensional structure is not provided in a peripheral circuit. When solely arranging such a capacitor having the same three-dimensional structure as a memory cell capacitor structure in the peripheral circuit region, therefore, distortion of the shape or the like results from pattern deformation due to halation or the like caused by the step of the peripheral circuit in an exposure step or stress caused by the step between the elements of the peripheral circuit region in fabrication process, and hence no capacitor having desired characteristics can be implemented. When repetitively arranging the program unit elements PR along the row direction as in the embodiment 1 of the present invention, pattern repetition is so attained that the program unit elements PR can be formed the same in shape as the memory cells MC with no influence by elements forming peripheral circuits. Thus, capacitor-type anti-fuses having desired characteristics can be implemented.

When the program unit elements PR are employed as anti-fuses, the number of the unit elements PR may be about several 10s.

When the program unit elements PRa to PRn are connected in parallel with each other to be utilized as a single programming element, the programming element can be employed as an anti-fuse if dielectric breakdown is caused in at least one capacitance element S. Even if the capacitance elements S are varied in breakdown voltage, therefore, programming can be reliably performed with no influence by the variation and a programming circuit having an excellent product yield can be implemented.

[Modification 1]

Figure 5:
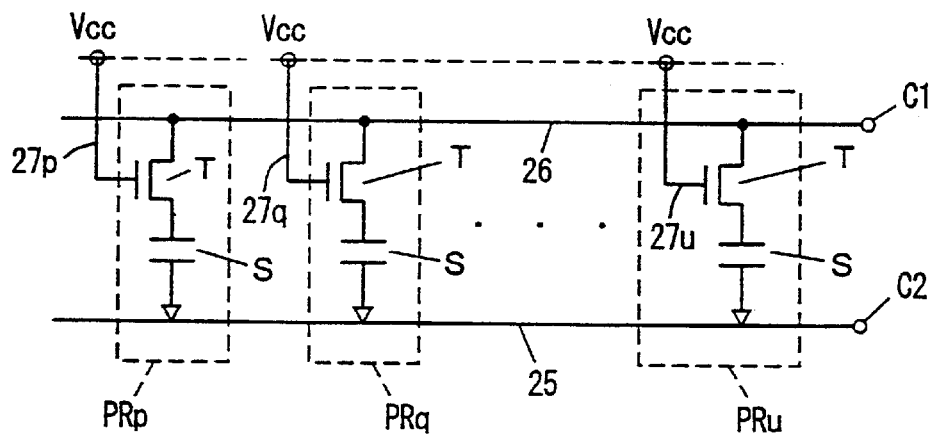
FIG. 5 illustrates the structure of a modification 1 of the embodiment 1 of the present invention.

FIG. 5 schematically illustrates the structure of a modification 1 of the embodiment 1 of the present invention. Referring to FIG. 5, program unit elements PRp to PRu are arranged in the same repetitive pattern as the column-directional arrangement pattern in a memory array. Each of the program unit elements PRp to PRu is the same in structure as memory cells MC, and includes a MOS transistor T and a capacitance element S.

First electrode nodes of the MOS transistors T are coupled to a conductive line 26 in common, and first electrode nodes (corresponding to cell plate electrode nodes of memory cell capacitors) of the capacitance element S are connected to a conductive line 25 in common. Gates of the MOS transistors T are coupled to receive a power supply voltage Vcc through conductive lines 27p to 27u respectively. The conductive lines 27p to 27u may be formed to be coupled in common to a single line for receiving the power supply voltage Vcc as shown by broken lines in FIG. 5, or may be individually connected to a power supply line if the power supply line is present in the vicinity.

Also in the programming element shown in FIG. 5, the same pattern is repeated in the column direction and the capacitance elements S having the same structure as that of the memory cell capacitors can be correctly formed in a peripheral circuit region with no influence by the patterns of elements forming peripheral circuits. Also in the arrangement shown in FIG. 5, the conductive line 26 forms a first electrode node C1 of the programming element, and the conductive line 25 forms a second electrode node C2 of the programming element. Thus, the capacitance elements S are coupled in parallel between the electrode nodes C1 and C2 and a capacitor-type anti-fuse having excellent area utilization efficiency can be formed. Further, an effect similar to that of the capacitor-type anti-fuse shown in FIG. 3 can be attained.

[Modification 2]

Figure 6A:
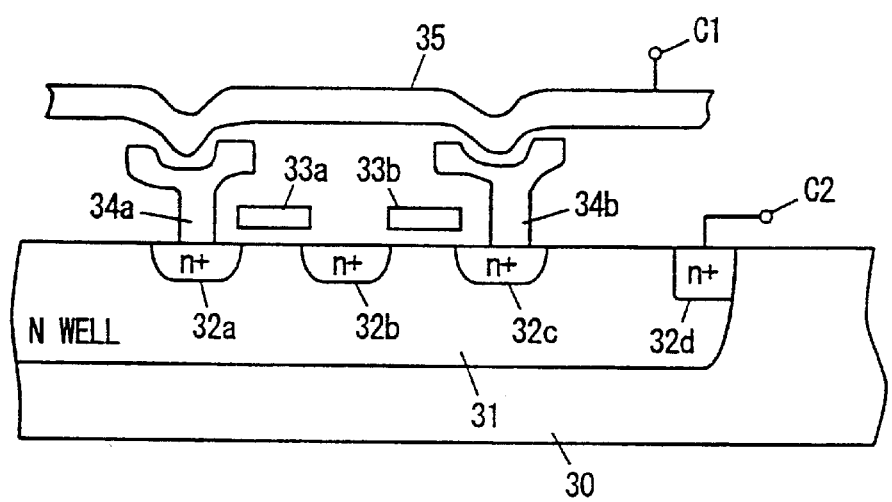
FIG. 6A illustrates the structure of a modification 2 of the embodiment 1 of the present invention.

FIG. 6A schematically illustrates the structure of a modification 2 of the embodiment 1 of the present invention. Referring to FIG. 6A, a capacitor-type anti-fuse is formed in an N well 31 formed on a surface of a semiconductor substrate region 30. N-type impurity regions 32a, 32b, 32c and 32d are formed on a surface-of the Newell 31. A conductor layer 33a is formed spacedly on a channel region between the impurity regions 32a and 32b with a gate insulation film (not shown) underlaid, while a conductor layer 33b is formed on a channel region between the impurity regions 32b and 32b. The impurity regions 32a and 32c are electrically connected to the conductor layers 34a and 34b separated from each other, respectively. A conductor layer 35 is formed continuously on the conductor layers 34a and 34b corresponding to memory cell storage nodes with a capacitor insulation film (not shown) underlaid.

The impurity region 32d is coupled to an electrode node C2, and the conductor layer 35 is coupled to an electrode node C1. Each of the conductor layers 34a and 34b forms a capacitance in a portion facing to the conductor layer 35. N well 31 is coupled to the electrode node C2 through the impurity region 32d. Thus, the impurity regions 32a, 32b and 32c are electrically connected with each other and coupled to the electrode node C2 in common.

Figure 6B:
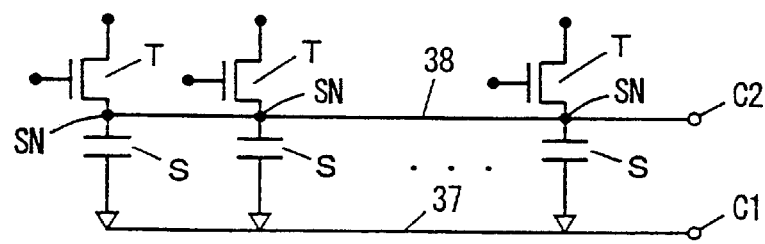
FIG. 6B illustrates an electric equivalent circuit of the structure shown in FIG. 6A.

FIG. 6B illustrates an electric equivalent circuit of the programming element shown in FIG. 6A. Referring to FIG. 6B, storage nodes SN (corresponding to the impurity regions 32a and 32c) of unit elements are coupled in common through a line 38, and second electrode nodes of capacitors S are coupled to the electrode node C1 through a line 37. The line 38 corresponds to the N well 31 shown in FIG. 6A The storage nodes SN each are a node between MOS transistor T and capacitance element S. As shown in FIG. 6B, the N well 31 serves as the line 38 and the electrode node C2 of the programming element, whereby the capacitance elements S are connected in parallel with each other between the electrode nodes C1 and C2. The conductor layers 33a and 33b forming gates of the MOS transistors T are provided as dummies for forming the same pattern as a memory cell array pattern. Therefore, the conductor layers 33a and 33b, may be set at arbitrary voltage levels or in electrically floating states. When the conductor layers 33a and 33b are connected to a power supply voltage Vcc, N-type impurities are attracted to regions between the impurity regions 32a and 32b and between the impurity regions 32b and 32c, whereby surface resistance of the N well 31 can be reduced to reduce the resistance of capacitor electrodes.

FIG. 6A shows no conductor layer corresponding to a bit line. In order to maintain the same pattern as the memory array, a conductor layer corresponding to a bit line may be electrically connected to the impurity region 32b. Also in this case, the conductor layer corresponding to the bit line is merely provided as a dummy (for maintaining the pattern identicalness).

The unit elements shown in FIG. 6A may be aligned along any of the row and column directions of the memory array.

[Modification 3]

Figure 7:
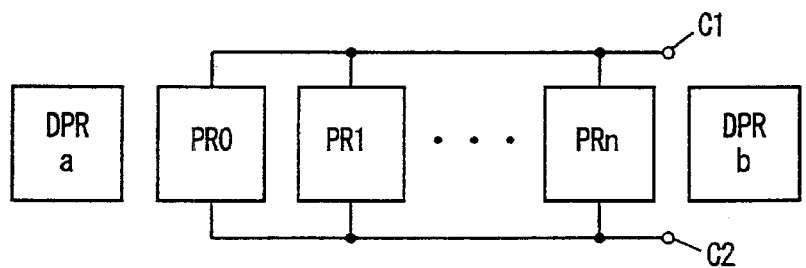
FIG. 7 schematically illustrates the structure of a modification 3 of the embodiment 1 of the present invention.

FIG. 7 schematically illustrates the structure of a modification 3 of the embodiment 1 of the present invention. Referring to FIG. 7, program unit elements PR0 to PRn are arranged alignedly to have the same arrangement pattern as that along a row direction or a column direction of a memory array. Dummy elements DPRa and DPRb are arranged alignedly on both sides of the unit elements PR0 to PRn. The dummy elements DPRa and DPRb are the same in layout pattern as the unit elements PR0 to PRn. The unit elements PR0 to PRn are connected in parallel with each other between electrode nodes C1 and C2. The dummy elements DPRa and DPRb are held in electrically floating states.

Unit elements PR0 to PRn are employed as capacitor-type anti-fuses, while the dummy elements DPRa and DPRb are not employed. The dummy elements DPRa and DPRb are provided for maintaining the continuity of the repetitive pattern in the direction of alignment of the unit elements PR0 to PRn. The endmost unit elements PR0 and PRn, on both sides of which the same repetitive patterns are arranged, can be formed under the same conditions as the other unit elements PR1, . . . , capacitance elements included in the unit elements PR0 and PRn are also formed under the same conditions as those of the other unit elements PR1, . . . , and capacitance elements being the same in structure and characteristics as memory cell capacitors can be reliably formed.

The unit elements PR are aligned along the row or column direction the above description. Alternatively, the unit elements PR may be two-dimensionally arranged along the row and column directions. In this case, nodes corresponding to a cell plate electrode nodes of the memory cell capacitors are connected in common to form one electrode of a programming element. When a substrate region is employed as an electrode of the programming element, a conductor layer corresponding to a bit line is in an electrically floating state and that corresponding to a word line is in an arbitrary connection state. When the capacitance elements are interconnected with each other through MOS transistors (corresponding to access transistors), a power supply voltage Vcc is applied to the conductor layer corresponding to the word lines. A capacitor-type anti-fuse having excellent area utilization efficiency can be implemented also by two-dimensionally arranging the unit elements.

[Modification 4]

Figure 8:
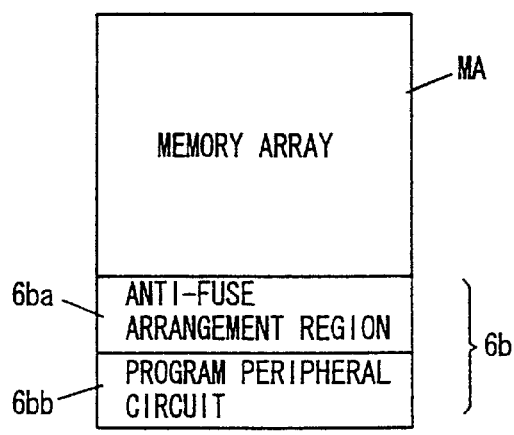
FIG. 8 schematically illustrates the structure of a modification 4 of the embodiment 1 of the present invention.

FIG. 8 schematically illustrates the structure of a modification 4 of the embodiment 1 of the present invention. Referring to FIG. 8, an antifuse arrangement region 6ba is provided adjacent to a memory array MA, and a program peripheral circuit 6bb is arranged neighboring or adjacent to the anti-fuse arrangement region 6ba. The anti-fuse arrangement region 6ba and the program peripheral circuit 6bb correspond to the programming circuit 6b shown in FIG. 2. In the memory array MA, memory cells MC are arranged in rows and columns. The memory cell arrangement pattern of the memory array MA is repeated to extend into the anti-fuse arrangement region 6ba. Thus, capacitance elements can be formed in the anti-fuse arrangement region 6ba in the same pattern as the repetitive pattern of the memory array MA. Unit elements PR0 to PRn can be readily formed by the capacitance elements and MOS transistors in the anti-fuse arrangement region 6ba by continuously repeating the repetitive pattern in the memory array MA Thus, the structure of preventing pattern discontinuity on end regions of the memory array MA itself can be utilized for the anti-fuse arrangement region 6ba, and unit elements being the same in structure (pattern) as the memory cells MC in the memory array MA can be correctly formed.

The program peripheral circuit 6bb includes a circuit for programming capacitor-type anti-fuses included in the anti-fuse arrangement region 6ba and reading data stored therein.

While the dummy elements DPRa and DPRb are arranged on both sides of the unit elements PR0 to PRn in FIG. 7, the number of the dummy elements DPRa and DPRb is arbitrary, provided that repetition of the same pattern uniformly influences the unit elements PR0 to PRn.

According to the embodiment 1 of the present invention, as hereinabove described, anti-fuses can be readily implemented by repetitively arranging memory cell structures alignedly when memory cell capacitor structures are employed as capacitor-type anti-fuses. Capacitor-type anti-fuses having desired characteristics can be formed even by arranging the capacitor-type anti-fuses in a peripheral circuit region. Further, formation of capacitor-type anti-fuses having incomplete structures can be prevented, and capacitor-type anti-fuses having high reliability are implemented.

[Embodiment 2]

Figure 9A:
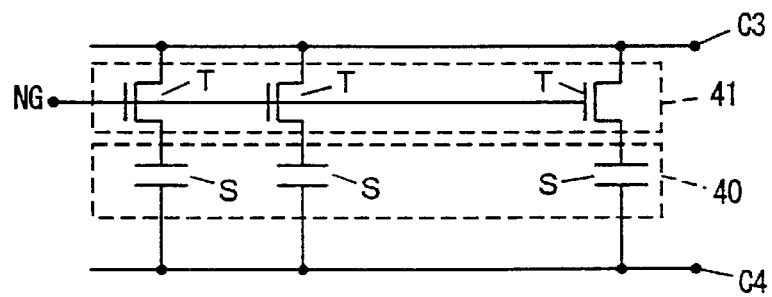
FIG. 9A illustrates the structure of a programming element according to an embodiment 2 of the present invention.
Figure 36A:
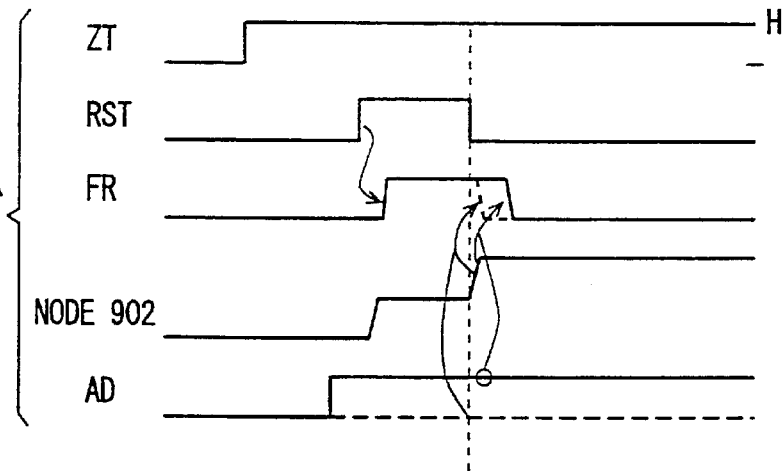
FIG. 36A is a signal waveform diagram representing operations in programming of the circuit shown in FIG. 35.
Figure 36B:
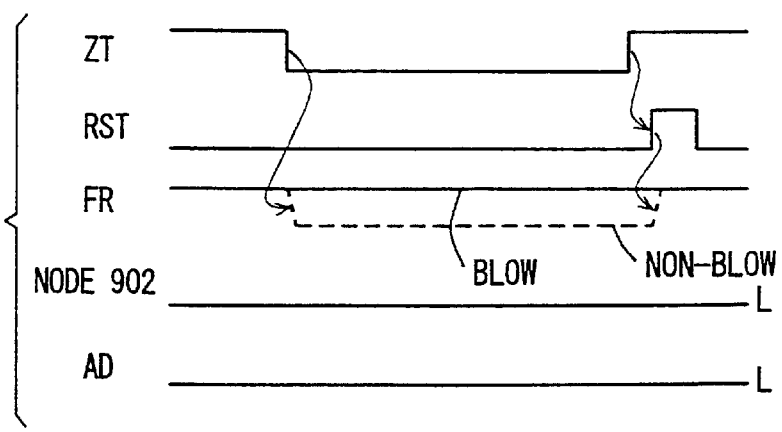
FIG. 36B is a signal waveform diagram representing operations in a normal operation mode of the circuit shown in FIG. 35.

FIG. 9A schematically illustrates the structure of an anti-fuse circuit according to an embodiment 2 of the present invention. This FIG. 9A shows the structure of a single capacitor-type anti-fuse 40. Referring to FIG. 9A, unit elements formed by series-connection bodies of MOS transistors T and capacitance elements S are connected in parallel with each other between nodes C3 and C4. Gates of the MOS transistors T are connected to a node NG in common. MOS transistors T are utilized as the decoupling transistor 903 shown in FIG. 36, while the capacitance elements S are utilized as the capacitor-type anti-fuse 40. The capacitance elements S may be aligned along any of a row and column directions in accordance with the embodiment 1.

Figure 9B:
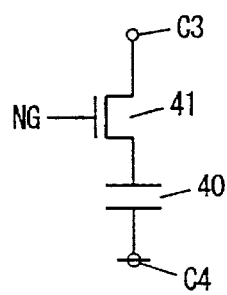
FIG. 9B illustrates an electric equivalent circuit of the structure shown in FIG. 9A.

FIG. 9B illustrates an electric equivalent circuit of the arrangement of the unit elements shown in FIG. 9A. Referring to FIG. 9B, a MOS transistor 41 and the capacitor-type anti-fuse 40 are serially connected between the nodes C3 and C4. The MOS transistor 41 is formed by a parallel-connection body of a plurality of MOS transistors T. Therefore, its channel width is so increased that a sufficently large current can be supplied, and current in blowing/non-blowing of the capacitor-type antifuse 40 can be sufficiently driven. Further, the MOS transistor 41 can drive a sufficiently large current also in determination of blowing/nonblowing of the anti-fuse 40, and blowing/non-blowing of the capacitor-type anti-fuse 40 can be determined at a high speed.

Figure 10A:
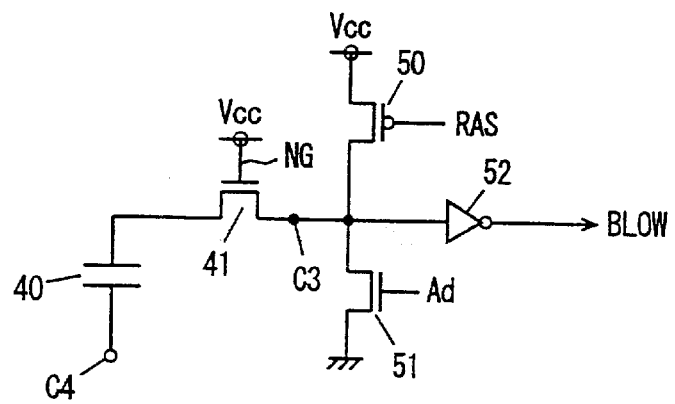
FIG. 10A schematically illustrates the structure of an anti-fuse circuit according to the embodiment 2 of the present invention.

FIG. 10A schematically illustrates the structure of a circuit employing the capacitor-type anti-fuse 40 according to the embodiment 2 of the present invention. This figure 10A shows a structure of a 1-bit anti-fuse circuit in a programming circuit.

Figure 10B:
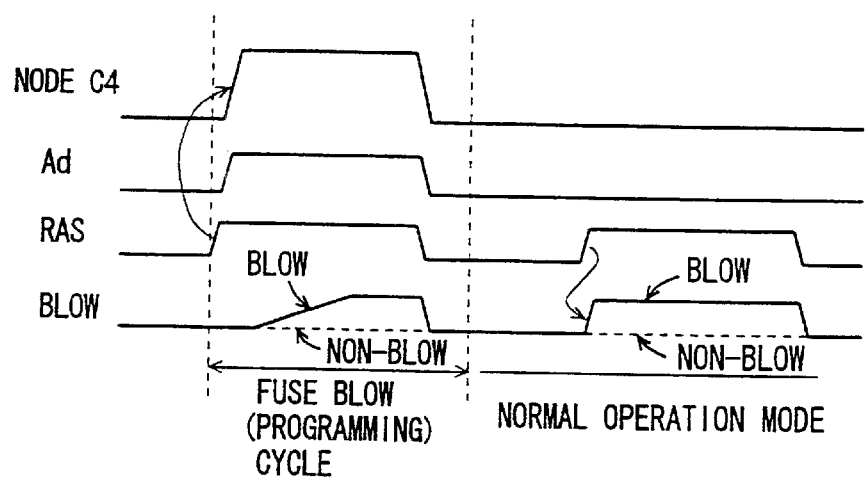
FIG 10B is a signal waveform diagram representing an operation of the anti-fuse circuit shown in FIG. 10A.

Referring to FIG. 10A, the anti-fuse circuit includes a p-channel MOS transistor 50 rendered conductive in response to inactivation (low level) of a memory cycle start instruction signal RAS for charging a node C3 to the level of a power supply voltage Vcc, an n-channel MOS transistor 51 selectively set in a conductive state in accordance with a signal Ad in a programming operation mode (fuse blow cycle), and an invertor circuit 52 for determining the voltage level of the node C3 to generate a signal BLOW indicating blowing/non-blowing of the anti-fuse 40 in a normal operation mode. The anti-fuse 40 has the structure shown in FIG. 9A, and the MOS transistor 41 shown in FIG. 9A is employed as a decoupling transistor for preventing application of a high voltage to the node C3 in the fuse blow cycle. A gate node NG of the MOS transistor 41 is coupled to receive the power supply voltage Vcc. Operations of the anti-fuse circuit shown in FIG. 10A are now described with reference to an operation waveform diagram shown in FIG. 10B.

In the fuse blow (programming) cycle, the signal RAS is set to a high level from a low level. In inactivation of the memory cycle start instruction signal RAS, the MOS transistor 50 is in a conductive state and the node C3 is held at a high level. The anti-fuse 40 has relatively high resistance (e.g., at least 5 KΩ) even when conductive (blown). Therefore, the instruction signal BLOW is at a high level.

In the fuse blow cycle, the memory cycle start instruction signal RAS is first raised to a high level for setting the MOS transistor 50 in a non-conductive state. us, for a precharging the node C3 to a high level is ended. Then, the signal Ad is set high or low in accordance with program data, and a high voltage for programming is applied to the node C4. When the MOS transistor 51 is rendered conductive, the voltage of the node C3 lowers toward a ground voltage level, and a high voltage is applied to the anti-fuse 40. When the voltage applied across the capacitor-type anti-fuse 40 exceeds the breakdown voltage of anti-fuse 40, the anti-fuse 40 causes dielectric breakdown and a current flows from the node C4 through the node C3 to a ground node.

The MOS transistor 51 has relatively high channel resistance, and the voltage of the node C3 is decreased in accordance with the resistance values of the anti-fuse 40 and the MOS transistor 51. When the voltage level of the node C3 goes below the input logic threshold voltage of the invertor circuit 52, the blow instruction signal BLOW rises to a high level. Only the decoupling transistor 41 can transmit a voltage Vcc−Vth, and the high voltage applied to the node C4 is prevented from being transmitted to the node C3.

When the signal Ad is at a low level, the MOS transistor 51 enters a non-conductive state. The node C3 is precharged to the level of the power supply voltage Vcc by the MOS transistor 50. Even if a high voltage is applied to the node C4, therefore, a voltage applied between electrodes of the anti-fuse 40 is not in excess of the breakdown voltage of the anti-fuse 40, which in turn is held in a non-blown state. Thus, the signal BLOW maintains a low level as shown by a broken line in FIG. 10B.

After a lapse of a prescribed time, the fuse blow cycle is completed, the memory cycle start instruction signal RAS is driven to a low level, and application of the high voltage to the node C4 is stopped.

In the normal operation mode, the signal Ad is set low. When the memory cycle start instruction signal RAS rises to a high level, the MOS transistor 50 enters a non-conductive state. In the normal operation mode, the MOS transistor 51 is regularly in a non-conductive state. Therefore, the voltage level of the node C3 is determined depending on the blown/non-blown state of the anti-fuse 40. When the anti-fuse 40 is blown (fuse-blown), the node C3 is-discharged through the MOS transistor 41 and the anti-fuse 40. The node C4 is held at the ground voltage level in the normal operation mode. Therefore, the signal BLOW rises to a high level and data stored in the anti-fuse circuit is read. When the anti-fuse 40 is non-blown, on the other hand, no path discharges the node C3 and hence the node C3 maintains a high level and the signal BLOW from the invertor circuit 52 holds a low level.

The anti-fuse 40 can be blown in accordance with a series of operations as described above.

FIG. 10A shows a mere exemplary structure of the programming circuit (anti-fuse circuit), which may be replaced with another structure.

As hereinabove described, the number of elements forming a programming circuit can be reduced to reduce the area occupied by the circuit by utilizing MOS transistors of unit elements as a decoupling transistor for preventing transmission of a high voltage in a programming operation (fuse blow cycle).

According to the embodiment 2 of the present invention, as hereinabove described, MOS transistors of unit elements are utilized not as anti-fuses but as elements forming a programming circuit (anti-fuse circuit), whereby the area occupied by the programming circuit can be reduced.

[Embodiment 3]

Figure 11A:
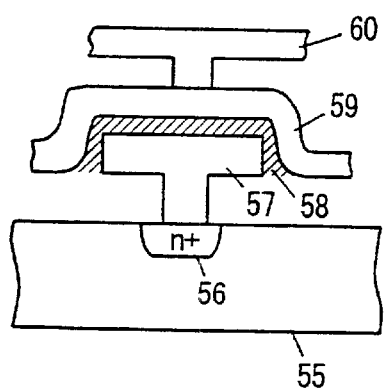
FIG. 11A illustrates a cross sectional structure of a programming element according to an embodiment 3 of the present invention, and FIG. 11B schematically illustrates the planar layout of the structure shown in FIG. 11A.

FIG. 11A schematically illustrates the cross sectional structure of a programming element according to an embodiment 3 of the present invention. This FIG. 11A shows the sectional structure of a capacitance element in a single unit element. Referring to FIG. 11A, the capacitance element includes a conductor layer 57 electrically connected to an impurity region 56 formed on a surface of a semiconductor substrate region 55, a conductor layer 59 formed on the conductor layer 57 with a capacitor insulation film 58 underlaid, and a low-resistance conductor layer 60 formed on and electrically connected to the conductor layer 59. The conductor layer 57 corresponds to a storage node of a memory cell capacitor, and the conductor layer 59 corresponds to a cell plate electrode of the memory cell capacitor. The conductor layer 59 corresponding to the cell plate electrode is provided in common to a plurality of capacitance elements. The low-resistance conductor layer 60 is formed for each capacitance element on a position facing to the conductor layer 57 with a contact hole placed thereunder.

Figure 11B:
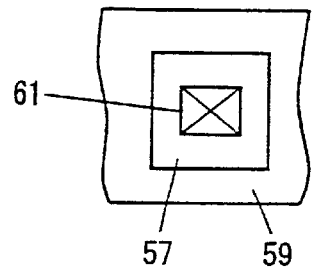

FIG. 11B schematically illustrates the planar layout of the capacitance element having the cross sectional structure shown in FIG. 11A. As shown in FIG. 11B, a contact hole 61 is formed to overlap with the conductor layer 57 in plan view, and electrically connects the low-resistance conductor layer 60 with the conductor layer 59 therethrough.

In a memory cell capacitor, an electrode layer for forming a cell plate electrode layer and a storage node is made of polysilicon. The polysilicon layer is doped with an impurity in a high concentration, in order to reduce resistance. A capacitance element of a capacitor-type anti-fuse is the same in structure as the memory cell capacitor, and hence the conductor layers 57 and 59 are also formed by a polysilicon layer doped with an impurity in a high concentration. The low-resistance conductor layer 60 is made of aluminum, for example. In electrically connecting the low-resistance conductor layer 60 to the conductor layer 59, the low-resistance conductor layer 60 is formed and patterned under a certain temperature condition. The impurities doped in the conductor layer 59 move toward the capacitor insulation film 58 in formation of contact, to change the characteristics of the capacitor insulation film 58. When the impurities move toward the capacitor insulation film 58, an electron/hole trap is generally formed in the capacitor insulation film 58 to deteriorate the insulation performance of the capacitor insulation film 58. Therefore, the breakdown voltage characteristic of the capacitance element can be reduced by forming the contact hole 61 to be faced to the conductor layer 57 corresponding to the storage node for electrically connecting the conductor layer 59 with the upper low-resistance conductor layer 60, thereby reducing the level of a voltage applied in programming. Thus, a programming element can be programmed with a relatively low voltage also in a semiconductor device driven with a low supply voltage.

In the structure shown in FIG. 11A, the low-resistance conductor layer 60 may be employed as one electrode node of the programming element, and also the conductor layer 59 corresponding to a cell plate electrode layer may be employed as an electrode node of the programming element. The low-resistance conductor layer 60 may be provided in correspondence to each capacitance element simply for reducing the breakdown voltage of the capacitance element.

[Modification 1]

Figure 12A:
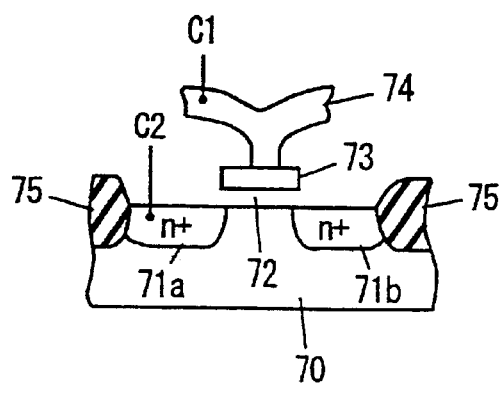
FIG. 12A illustrates a cross sectional structure of a modification 1 of the embodiment 3 of the present invention, and FIG. 12B schematically illustrates the plane layout of the structure shown in FIG. 12A.

FIG. 12A schematically illustrates the structure of a modification 1 of the embodiment 3 of the present invention. This FIG. 12A schematically illustrates the cross sectional structure of a single MOS capacitor. Referring to FIG. 12A, impurity regions 71a and 71b are formed on a surface of a semiconductor substrate region 70. A gate electrode layer 73 is formed on a channel region between the impurity regions 71a and 71b on a gate insulation film 72. The gate electrode layer 73 is electrically connected with an upper conductor layer 74 on the channel region. A field isolation film 75 for element isolation is formed to enclose the impurity regions 71a and 71b.

Figure 12B:
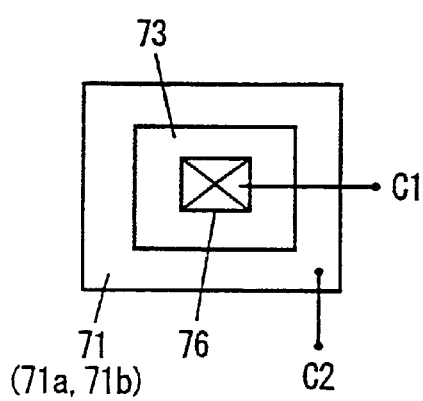

FIG. 12B schematically illustrates the planar layout of the MOS capacitor shown in FIG. 12A. Referring to FIG. 12B, the impurity region 71 (71a and 71b) is formed to endorse the gate electrode layer 73. The gate electrode layer 73 is electrically connected with the upper conductor layer 74 through a contact hole 76 formed to overlap with the channel region in plan view. FIG. 12B does not show upper conductor layer 74, in order to simplify the illustration.

As shown in FIGS. 12A and 12B, the contact hole 76 is formed on the channel region in the MOS capacitor structure. Therefore, an impurity doped in the gate electrode layer 73 is diffused into the gate insulation film 72 to reduce the breakdown voltage in formation of the contact hole 76 and in formation of electrical contact between the upper conductor layer 74 and the gate electrode layer 73. Therefore, the breakdown voltage of the MOS capacitor can be reduced, and therefore the MOS capacitor can be used as an anti-fuse.

In a general MOS transistor structure, the breakdown voltage of a gate insulation film is set higher than a P-N junction breakdown voltage (the breakdown voltage of the junction between the impurity region 71 and the substrate region 70) and a source-to-drain voltage, in order to ensure its reliability against the high electric field. This is for stably operating the MOS transistor, in which a high electric field is readily generated in the vicinity of its drain or the like in general. When such a general MOS transistor structure is employed as a capacitor-type anti-fuse, therefore, junction breakdown or source-to-drain shorting results from application of a high voltage for programming. The breakdown voltage can be reduced by forming a contact hole on a channel region and electrically connecting a gate electrode layer with an upper conductor layer, as shown in FIGS. 12A and 12B. Thus, a MOS transistor having the same structure as a general MOS transistor structure for a peripheral circuit can be employed as a capacitor-type anti-fuse in a peripheral circuit region, with no necessity for an additional fabrication step for forming the anti-fuse.

In the MOS capacitor structure shown in FIGS. 12A and 12B, the conductor layer 74 forms a first electrode node C1 of a programming element, and the impurity region 71 (71a, 71b) forms a second electrode node C2 of the programming element.

[Modification 2]

Figure 13:
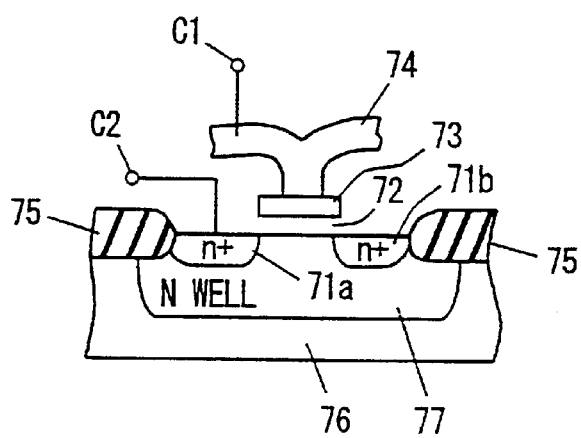
FIG. 13 schematically illustrates the structure of a modification 2 of the embodiment 3 of the present invention.

FIG. 13 schematically illustrates the structure of a modification 2 of the embodiment 3 of the present invention. Referring to FIG. 13, a programming element is formed in an N well 77 formed on a surface of a semiconductor substrate 76. Impurity regions 71a and 71b are formed in the N well 77 employed as a substrate region. The remaining structure of this modification is identical to that shown in FIGS. 12A and 12B, and corresponding parts are denoted by the same reference numerals. In the structure shown in FIG. 13, the N well 77 of the same conductivity type as that of the impurity regions 71a and 71b is employed as the substrate region. Therefore, a capacitor-type anti-fuse having the same structure as a general parallel electrode capacitor is implemented. Also in this case, a contact hole is formed on a region between the impurity regions 71a and 71b for electrically connecting a gate electrode layer 73 with a conductor layer 74 through the contact hole. Thus, the breakdown voltage of a gate insulation film 72 can be reduced.

In the N well 77, a single or a plurality of MOS transistors may be formed. In this case, MOS transistors having the same size as access transistors can be formed by a desired number in the same step as the fabrication step of an access transistor in a DRAM cell. Also in a cell structure not employing capacitors for storing information such as that of an SRAM (static random access memory) or a flash memory (collective erase EEPROM), MOS transistors for capacitor-type anti-fuses can be formed in the same step as a memory cell fabrication step or a peripheral MOS transistor fabrication step. Thus, capacitor-type anti-fuses having a low breakdown voltage can be implemented with no requirement for an additional fabrication step. A plurality of MOS capacitors may be connected in parallel with each other as an anti-fuse.

According to the embodiment 3 of the present invention, as hereinabove described, a second electrode node of a capacitance element is electrically connected to another conductor layer on a region facing to a first electrode of the capacitance element employed as a programming element, whereby the breakdown voltage of the capacitance element can be reduced for correctly programming the same with a low programming voltage. Further, the capacitance element can be formed in the same step as a memory cell or peripheral circuit fabrication step, and can be readily fabricated with no additional fabrication step.

[Embodiment 4]

Figure 14:
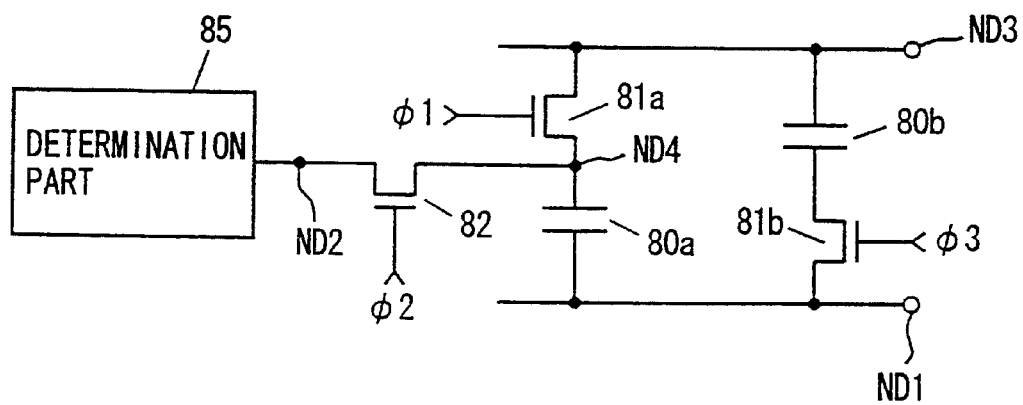
FIG. 14 schematically illustrates the structure of an anti-fuse circuit according to an embodiment 4 of the present invention.

FIG. 14 illustrates the structure of a programming circuit according to an embodiment 4 of the present invention. This FIG. 14 shows the structure of a part of an anti-fuse circuit for 1-bit of an address signal. Referring to FIG. 14, the anti-fuse circuit includes first and second capacitor-type anti-fuses 80a and 80b. Each of the capacitor-type anti-fuses 80a and 80b includes a capacitance element having the same structure as a memory cell capacitor, similarly to the structure according to the embodiment 1 or 2. The first capacitor-type anti-fuse 80a has a first electrode node coupled to a node ND 1 and a second electrode node connected to a node ND3 through a MOS transistor 81a. The second capacitor-type anti-fuse 8b has a first electrode node connected to the node ND3 and a second electrode node connected to the node ND1 through a MOS transistor 81b. The MOS transistor 81a receives a control signal φ1 on its gate while the MOS transistor 81b receives a control signal φ3 on its gate. These MOS transistors 81a and 81b include MOS transistor elements having the same structure as access transistors of memory cells (refer to the embodiment 1).

The anti-fuse circuit further includes a MOS transistor 82 connected between nodes ND2 and ND4 and receiving a control signal φ2 on its gate and a determination part 85 outputting a signal for determining blowing/non-blowing of the capacitor-type anti-fuses 80a and 80b in accordance with the signal potential of the node ND2. The determination part 85 includes a precharge element for precharging the node ND2 to a prescribed potential and an invertor circuit for determining the voltage level of the node ND2.

In an integrated DRAM, the memory cell size is shrunk. Following this shrinking, a capacitor insulation film of a memory cell capacitor is also reduced in thickness for ensuring a sufficient capacitance value in a small area. In order to guarantee breakdown voltage characteristics in a thin capacitor insulation film, an intermediate voltage of Vcc/2 is generally applied to a cell plate electrode node of the memory cell capacitor. A power supply voltage Vcc or a voltage of a ground voltage level is transmitted to a storage node of the memory cell capacitor. Thus, merely a voltage of Vcc/2 at the maximum is applied across memory cell capacitor in a normal operation, for protecting the thin capacitor insulation film against dielectric breakdown by application of an excessive voltage.

When a capacitance element having the same characteristics as the memory cell capacitor is employed as an anti-fuse, the power supply voltage Vcc is applied across a capacitor in the conventional structure. Therefore, an excessive voltage is applied to a non-blown capacitor-type anti-fuse, reliability cannot be guaranteed and program data cannot be correctly stored (when dielectric breakdown is caused).

In the anti-fuse circuit shown in FIG. 14, therefore, the first and second anti-fuses 80*a* and 80*b* are connected in parallel with each other in a fuse blow cycle (programming operation mode), for programming storage information with a low programming voltage. In a normal operation mode, the anti-fuses 80*a* and 80*b* are serially connected with each other so that the voltage Vcc/2 at the maximum is applied to each of the anti-fuses 80*a* and 80*b*. Operations of the anti-fuse circuit shown in FIG. 14 are now described.

(i) Fuse Blow Program

Figure 15A:
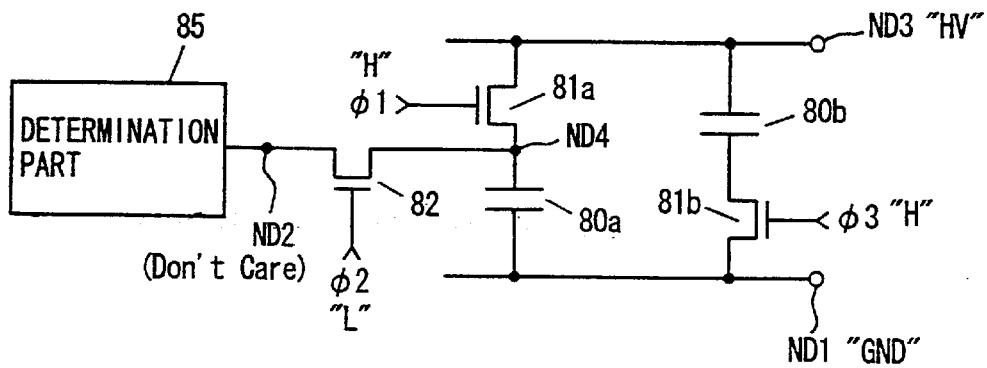
FIG. 15A illustrates an applied voltage in a programming operation mode of the anti-fuse circuit shown in FIG. 14.

An applied voltage in the fuse blow program of the anti-fuse circuit is now described with reference to FIG. 15A. As shown in FIG. 15A, the control signals φ1 and φ3 are set high while the control signal φ2 is set low in the fuse blow program. The node ND1 is coupled to receive a ground voltage GND, while a high voltage HV for programming is transmitted to the node ND3. The MOS transistor 82 is rendered non-conductive due to the low level of the control signal φ2, while the voltage level of the node ND2 is arbitrary (don't care state).

Figure 15B:
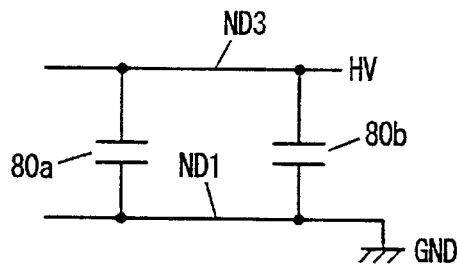
FIG. 15B illustrates an electric equivalent circuit of the structure shown in FIG. 15A.

In the voltage application shown in FIG. 15A, the capacitor-type anti-fuses 80*a* and 80*b* are connected in parallel between the nodes ND1 and ND3, as shown in FIG. 15B. The high voltage HV for programming is applied to the node ND3, while the node ND1 is at the level of the ground voltage GND. Therefore, dielectric breakdown is caused on the capacitor-type anti-fuses 80*a* and 80*b*, which in turn are rendered conductive.

(ii) Fuse Non-Blow Program

Figure 16A:
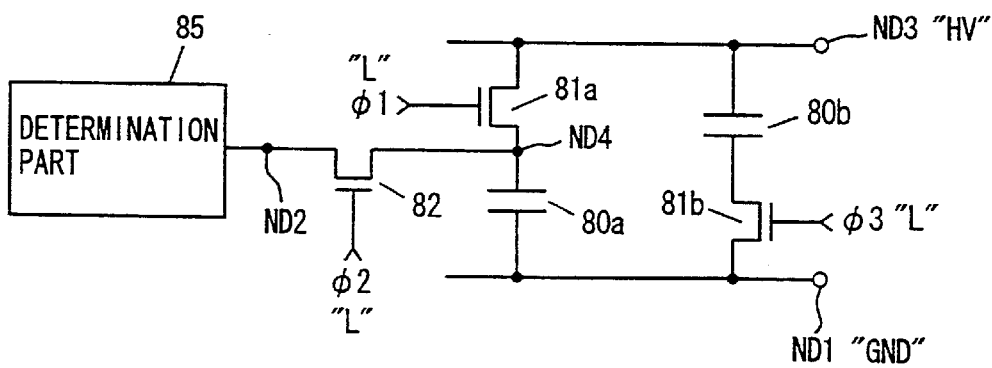
FIG. 16A illustrates an applied voltage in fuse blowing in the circuit shown in FIG. 14.
Figure 16B:
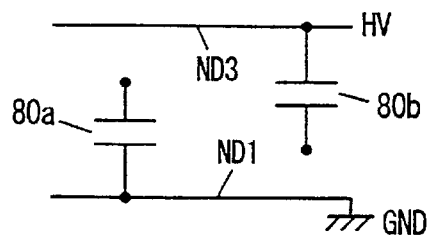
FIG. 16B illustrates an electric equivalent circuit of the structure shown in FIG. 16A.

In a fuse non-blow program, all control signals φ1 to φ3 are set low as shown in FIG. 16A. The high voltage HV for programming is transmitted to the node ND3, while the ground voltage GND is transmitted to the node ND1. In this state, all MOS transistors 81*a*, 81*b* and 82 are non-conductive. Therefore, the first electrode node of the capacitor-type anti-fuse 80*a* is coupled to the node NDI while the second electrode node thereof is in a floating state, as shown in FIG. 16B. Further, the capacitor-type anti-fuse 80*b* has the first electrode node coupled to the node ND3, and the second electrode node kept in a floating state. Even if the high voltage HV for programming is applied to the node ND3, therefore, no high voltage is applied across the anti-fuses 80*a* and 80*b* and dielectric breakdown is not caused. Thus, the capacitor-type anti-fuses 80*a* and 80*b* are programmed in non-conductive states.

(iii) Normal Operation Mode

Figure 17A:
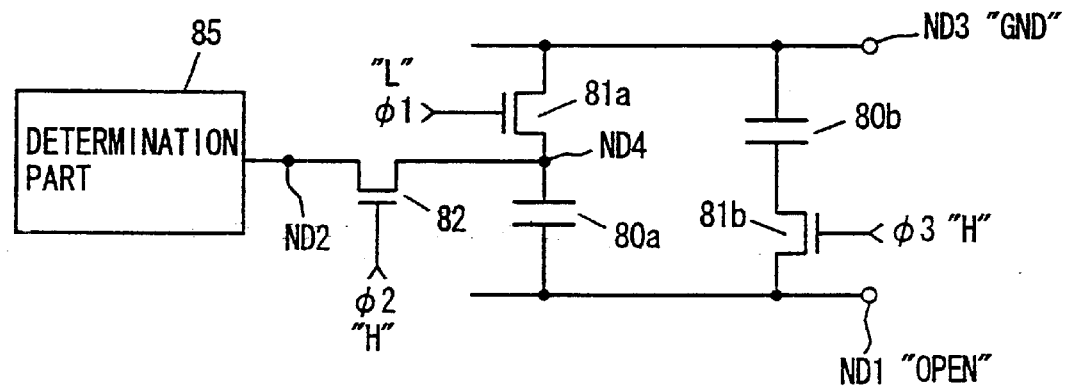
FIG. 17A illustrates an applied voltage in a normal operation mode of the circuit shown in FIG. 14.
Figure 17B:
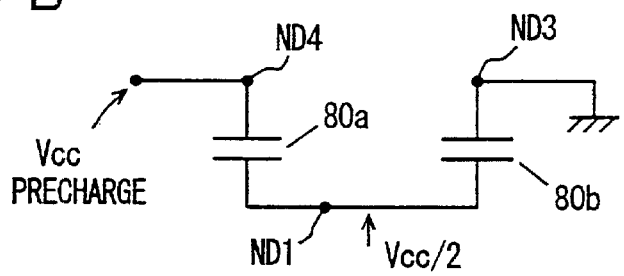
FIG. 17B illustrates an electric equivalent circuit of the structure shown in FIG. 17A.

As shown in FIG. 17A, the control signal φ1 is set low and the control signals φ2 and φ3 are set high in a normal operation mode. In this state, the MOS transistor 81*a* is rendered non-conductive while the MOS transistors 81*b* and 82 are rendered conductive. The ground voltage GND is transmitted to the node ND3, while the node ND1 is set in an open state (floating state). In this state, the capacitor-type anti-fuses 80*a* and 80*b* are serially connected between the nodes ND4 and ND3, as shown in FIG. 17B. The node ND4 is precharged to the level of the power supply voltage Vcc in the normal operation mode due to precharging of the node ND2. The capacitance values of the capacitor-type anti-fuses 80*a* and 80*b* are equal to each other. The voltage level of the node ND1 substantially reaches Vcc/2 due to capacitive division by the capacitor-type anti-fuses 80*a* and 80*b*. Therefore, merely the voltage Vcc/2 is applied across the capacitor-type anti-fuses 80*a* and 80*b* at the maximum. Also when capacitance elements having the same structure as memory cell capacitors are employed for the capacitor-type anti-fuses 80*a* and 80*b*, merely a voltage of the same value as that regularly applied across the memory cell capacitors is applied and the breakdown voltage characteristics are sufficiently guaranteed so that storage information can be stably held with no dielectric breakdown.

The determination part 85 is merely required to include an invertor circuit for inverting the voltage level of the node ND2 and a precharge circuit for precharging the node ND2 to the level of the power supply voltage Vcc. The programming operation is performed while rendering the MOS transistor 82 non-conductive, and hence the determination part 85 does not utilize MOS transistor (MOS transistor 51 shown in FIG. 10) for forming a current path in particular.

Figure 18:
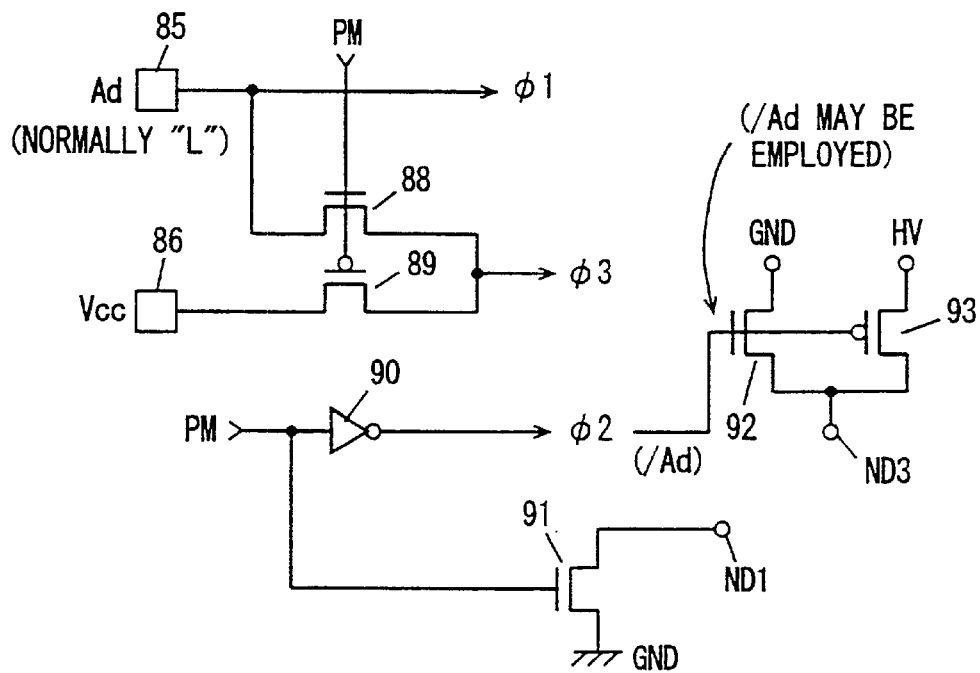
FIG. 18 illustrates the structure of a portion generating control signals shown in FIG. 14.

FIG. 18 schematically illustrates the structure of a control part of a 1-bit anti-fuse circuit. Referring to FIG. 18, the anti-fuse circuit includes a node 85 receiving a program address signal bit Ad to form the control signal φ1, a node 86 receiving the power supply voltage Vcc, an n-channel MOS transistor 88 rendered conductive in activation of a program mode instruction signal PM for transmitting the address signal bit Ad on the node 85 to form the control signal φ3, a p-channel MOS transistor 89 rendered conductive in inactivation of the program mode instruction signal PM for transmitting the power supply voltage Vcc on the power supply node 86 to form the control signal φ3, and an invertor circuit 90 for inverting the program mode instruction signal PM to form the control signal φ2.

The MOS transistors 88 and 89 may be replaced by CMOS transmission gates. The set of MOS transistors 87, 88 and 89 is provided in correspondence to each anti-fuse circuit. The control signal φ2 from the invertor circuit 90 is formed in common to anti-fuse circuits for a single address and supplied in common to the anti-fuse circuits receiving different address signal bits respectively for the single address.

The anti-fuse circuit further includes an n-channel MOS transistor 91 rendered conductive in activation of the program mode instruction signal PM for transmitting the ground voltage GND to the node ND1, an n-channel MOS transistor 92 rendered conductive in response to activation (high level) of the control signal φ2 for transmitting the ground voltage GND to the node ND3, and a p-channel MOS transistor 93 rendered conductive in inactivation (low level) of the control signal φ2 for transmitting the high voltage HV to the node ND3.

In the programming operation mode, the address signal bit Ad of the node 85 is set high or low depending on a defective address. MOS transistor 88 is rendered conductive and the control signals φ1 and φ3 are set high or low in accordance with the address signal bit Ad.

In the normal operation mode, the address signal bit Ad on the node 85 is fixed at a low level. Therefore, the control signal φ1 is fixed at a low level and MOS transistor 81*a* of the anti-fuse circuit is held in a non-conductive state. On the other hand, MOS transistor 89 is rendered conductive, the control signal φ3 is fixed at a high level, and MOS transistor 81b of the anti-fuse circuit is fixed in a conductive state.

The node ND3 receives the high voltage HV for programming through the MOS transistor 93 in the programming operation mode, and receives the ground voltage GND through the MOS transistor 92 in the normal operation mode. The node ND 1 receives the ground voltage GND through the MOS transistor 91n the programming operation mode while held in a floating state in the normal operation mode since the MOS transistor 91 is rendered non-conductive.

The capacitor-type anti-fuses 80a and 80b can be programmed in accordance with the address signal bit Ad to be programmed by utilizing the structure shown in FIG. 18 in each anti-fuse circuit.

The node 86 has only to be connected to a normal power supply line.

The high voltage HV for programming and the ground voltage GND may be selectively transmitted to the node ND3 from a program control circuit similar to that shown in FIG. 2 depending on the operation mode. As for a circuit for generating the high voltage HV for programming, an output signal of a high voltage generation circuit driving a word line boosted voltage employed for boosting up a word line can be utilized in a DRAM, for example. Alternatively, the high voltage HV may be externally supplied in the programming operation mode.

In the aforementioned structure, the control signals φ1 and φ3 are set high or low in the programming operation mode in response to the address signal bit Ad to be programmed. Alternatively, the control signals φ1 and φ3 may be regularly set high in the programming operation mode so that the high voltage HV or the ground voltage GND is selectively transmitted to the node ND3 in accordance with the address signal bit Ad to be programmed. An inverted signal (parenthesized in FIG. 18) of the address signal bit Ad to be programmed may be simply supplied to the MOS transistors 92 and 93. The anti-fuse circuit may be formed using a single capacitance element.

According to the embodiment 4 of the present invention, as hereinabove described, capacitor-type anti-fuses having the same structure as memory cell capacitors are connected in parallel in a programming operation mode while serially connected in a normal operation mode. In the normal operation mode, therefore, only the voltage of Vcc/2 is applied between the electrodes of the capacitor-type anti-fuses, deterioration of breakdown voltage characteristics can be prevented, and an anti-fuse circuit capable of correctly holding program information can be implemented.

[Embodiment 5]

Figure 19:
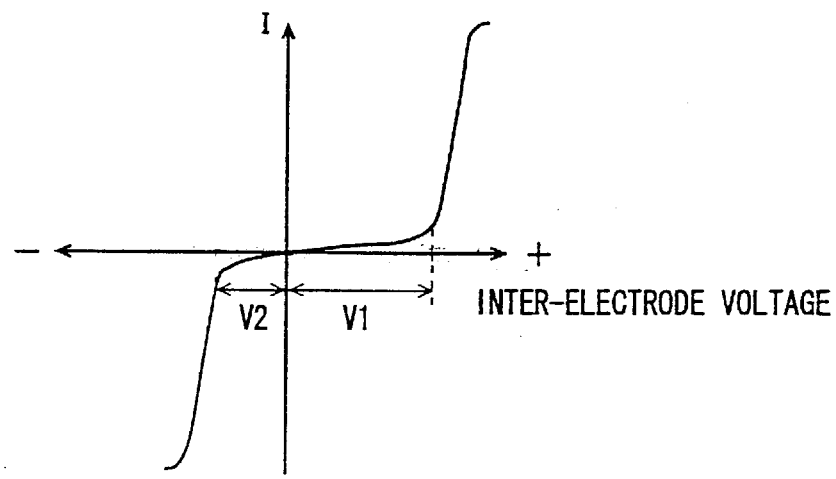
FIG. 19 illustrates the breakdown voltage characteristic of a capacitor according to an embodiment 5 of the present invention.

FIG. 19 illustrates the relation between an inter-electrode voltage of a capacitor and a current. Referring to FIG. 19, dielectric breakdown is caused and a high current I flows when the inter-electrode voltage is V1. With reversely applied voltage, dielectric breakdown is caused at a voltage—V2. In general, a capacitor has asymmetricity in its breakdown characteristics, as shown in FIG. 19. The general reason why the breakdown voltage characteristics are asymmetlical between the positive and negative directions of the inter-electrode voltage is now described.

Figure 20A:
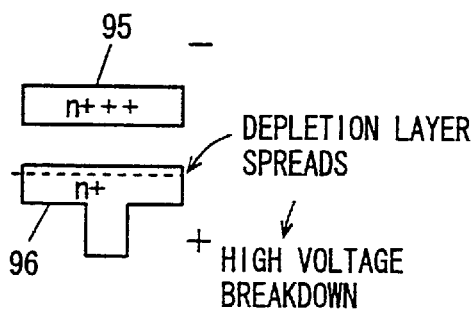
FIGS. 20A and 20B illustrate asymmetrical breakdown voltage characteristics.

FIG. 20A illustrates a cell plate electrode layer 95 and a storage node electrode layer 96 of a memory cell capacitor. In general, a constant voltage is transmitted to the cell plate electrode layer 95, which in turn is doped with an impurity (n-type impurity) in a high concentration for sufficiently reducing its resistance. On the other hand, the dose for a conduction node of the storage node electrode 96 is relatively reduced in order to prevent bad influence by impurity diffusion to a substrate region or the like (while resistance is reduced). Therefore, the cell plate electrode layer 95 and the storage node electrode layer 96 are doped with the impurity in different quantities. The cell plate electrode layer 95 and the storage node electrode layer 96 are formed by polysilicon layers and have characteristics as semiconductors. When such semiconductor layers have different impurity concentrations, an energy band is bent in the interface region.

A capacitance element having the cell plate electrode layer 95 and the storage node electrode layer 96 as electrodes is employed as a capacitor. The voltage of the conductor layer 95 corresponding to the cell plate electrode is rendered higher than that of the conductor layer 96 corresponding to the storage node electrode. In this case, a capacitor insulation film produces charges in the same quantity as those induced by the conductor layer 95 on the interface to the conductor layer 96.

When positively biasing the voltage of the conductor layer 96 with respect to the conductor layer 95, the so-called n+/i/n junction enters a "reverse-biased state",and a depletion layer spreads in the conductor layer 96. The depletion layer is generally formed in the conductor layer 96. This depletion layer, is a region having no charges, and serves as a capacitance. In this state, therefore, the depletion layer reduces an electric field applied across to the capacitor insulation film, thereby increasing the breakdown voltage. In a contrary case, no depletion layer spreads and the breakdown voltage is determined by that of the insulation film itself.

Figure 20B:
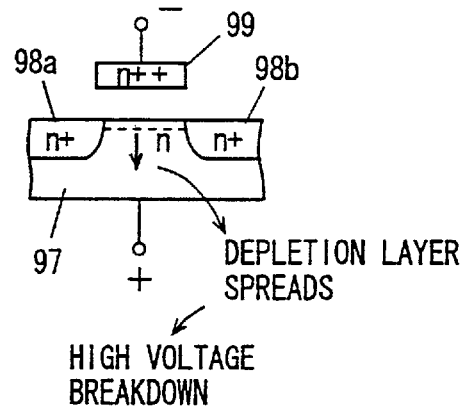

Consider a case of utilizing a MOS capacitor as shown in FIG. 20B. In this case, the MOS capacitor includes high-concentration impurity regions 98a and 98b formed on a surface of a semiconductor substrate region 97 and a gate electrode layer 99 formed on a channel region between the impurity regions 98a and 98b. MOS capacitor is generally formed employing a depletion type MOS transistor. In order to efficiently form the channel layer while preventing influence by the threshold voltage of the MOS transistor, a surface of the channel region is doped with an n-type impurity. When the gate electrode layer 99 is biased to a positive voltage with respect to the substrate region 97 in this state, electrons are attracted to the surface of the channel region to enter the so-called accumulation state, for forming a general capacitor.

When the gate electrode layer 99 is biased to a negative voltage with respect to the substrate region 97, electrons are retracted from the interface by the negative voltage of the gate electrode layer 99 on the surface of the channel region, and a depletion layer is formed in the channel region to spread. When the substrate region 97 is biased to a positive voltage with respect to the gate electrode layer 99, therefore, a depletion layer spreads, an electric field applied between the gate electrode layer 99 and the substrate region 97 is equivalently reduced, and the breakdown voltage is increased.

A multilayer film such as an ONO film (oxide film-nitride film-oxide film) is employed for a general capacitor insulation film or gate insulation film. In such a multilayer film including layers having different thicknesses, an electric field applied to each insulation film varies with the direction of voltage application. Such asymmetlicity of the thicknesses of the multilayer film also causes asymmetry of the breakdown voltage.

According to the embodiment 5 of the present invention, dielectric breakdown is caused in a direction of providing a high breakdown voltage and the capacitor is used in an opposite direction in a normal operation through the asymmetry of the breakdown voltage characteristics of the capacitor.

Figure 21A:
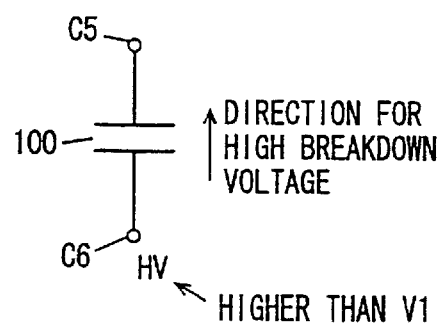
FIG. 21A illustrates the direction of a voltage applied in programming in an embodiment 5 of the present invention.

As shown in FIG. 21A, the high voltage HV is applied to the electrode node C6 of the capacitor-type anti-fuse 100 in the programming operation mode. The breakdown voltage of the capacitor-type anti-fuse 100 is increased when the electrode node C6 is positively biased with respect to the electrode node C5. The high voltage HV for programming is applied in the direction providing the high breakdown voltage, for blowing the capacitor-type anti-fuse 100. Thus, the capacitor-type anti-fuse 100 is reliably blown.

Figure 21B:
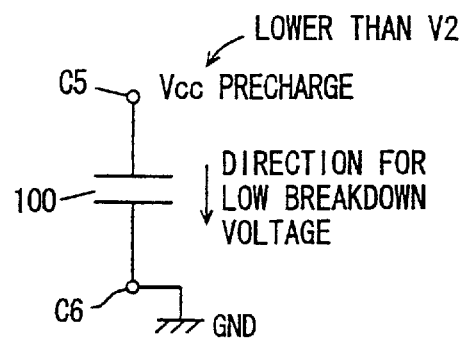
FIG. 21B illustrates the direction of a voltage applied to a capacitor in a normal operation mode of the embodiment 5 of the present invention.

In the normal operation mode, the electrode node C5 is biased to a positive voltage with respect to the electrode node C6, as shown in FIG. 21B. The electrode node C5 is precharged to the power supply voltage Vcc in the normal operation mode. The electrode node C6 is coupled to receive the ground voltage GND. When the electrode node C5 is biased to the positive voltage with respect to the electrode node C6, the breakdown voltage of the capacitor-type anti-fuse 100 is reduced. A voltage lower than the low breakdown voltage is applied between the electrode nodes C5 and C6. Therefore, the broken-down (fuse-blown) capacitor-type anti-fuse 100 is reliably in a fuse-blown state, and the fuse-blown/non-blown state can be correctly determined.

Consider a case of performing programming in the opposite direction shown in FIG. 21B and applying a voltage in the direction shown in FIG. 21A for performing the normal operation. While dielectric breakdown is caused if the voltage of—V2 is applied in FIG. 19 in this case, no dielectric breakdown is caused when the voltage V1 is applied. Therefore, the blown/non-blown state of the fuse cannot be correctly determined (a blown fuse may be erroneously determined as a non-blown fuse).

The anti-fuse to be blown can be reliably blown regardless of the direction of the inter-electrode voltage by applying the high voltage HV for programming in the direction providing the high breakdown voltage.

The structure shown in FIG. 10A or 14 can be applied to voltage application for the capacitor-type anti-fuse 100 shown in FIGS. 21A and 21B. The electrode nodes have only to be appropriately connected depending on the characteristics of the formed programming element (anti-fuse).

The characteristics of the capacitor shown in FIGS. 20A and 20B are general characteristics. A capacitor having different characteristics may possibly be formed in actual fabrication steps. In this case, general characteristics of the capacitor (memory cell capacitor or MOS capacitor) can be measured in the stage of preparation of a specimen for determining the direction providing a high breakdown voltage on the basis of the measured parameters. Alternatively, a monitor chip may be formed in fabrication of the products for measuring the characteristics of a capacitor of the monitor chip to recognize the direction of the breakdown voltage of the capacitor.

According to the embodiment 5 of the present invention, as hereinabove described, blowing/non-blowing of a capacitor-type anti-fuse can be reliably confirmed by changing the polarity of a voltage applied to the capacitor-type anti-fuse in accordance with asymmetry of the breakdown voltage characteristics thereof between a programming operation (fuse blow operation) and a normal operation, and further a blown state of the capacitor can be correctly held also in the normal operation, whereby blowing/non-blowing of the anti-fuse can be correctly determined.

[Embodiment 6]

Figure 22A:
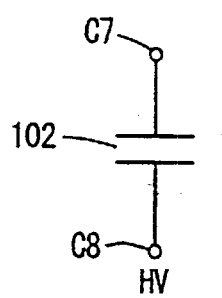
FIG. 22A illustrates the direction of a voltage applied in programming in an embodiment 6 of the present invention.
Figure 22B:
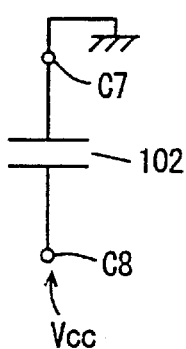
FIG. 22B illustrates the direction of a voltage applied to a capacitor in a normal operation mode in the embodiment 6 of the present invention.

FIGS. 22A and 22B illustrate voltage application modes for a capacitor-type anti-fuse 102 according to an embodiment 6 of the present invention. FIG. 22A shows a voltage application mode in a programming operation, and FIG. 22B shows that in a normal operation mode.

Referring to FIG. 22A, the capacitor-type anti-fuse 102 has a memory cell capacitor structure or a MOS capacitor structure, and a high voltage HV for programming is applied between its electrode nodes C7 and C8 with voltage polarity providing a low breakdown voltage. Consider that the breakdown voltage of the capacitor-type anti-fuse 102 is reduced when the electrode node C8 is positively biased with respect to the electrode node C7. The high voltage HV for programming is applied to the electrode node C8 in this state.

In the normal operation mode, a power supply voltage Vcc is applied to the electrode node C8 and the electrode node C7 is coupled to a ground voltage level, as shown in FIG. 22B. In other words, the voltages of the same polarity are applied to the capacitor-type anti-fuse 102 in the programming operation mode and in the normal operation mode. The level of the high voltage HV for programming is applied in the direction providing the low breakdown voltage, and can be reduced, readily causing dielectric breakdown.

In order to implement the voltage application modes shown in FIGS. 22A and 22B, connection of the electrode nodes C7 and C8 of the anti-fuse 102 have only to be switched in the structure of the anti-fuse circuit shown in FIG. 14 or the like. In this case, however, the circuit structure is somewhat complicated.

Figure 23A:
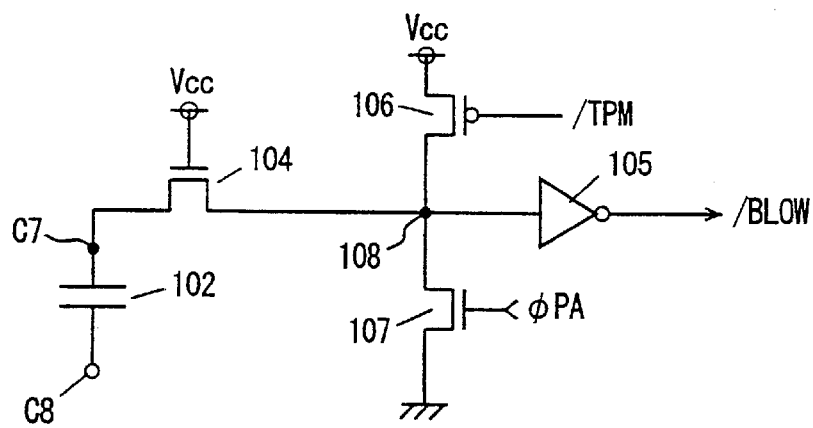
FIG. 23A schematically illustrates the structure of an anti-fuse circuit receiving the voltages shown in FIGS. 22A and 22B.

FIG. 23A schematically illustrates the structure of an anti-fuse circuit employed in the embodiment 6 of the present invention. Referring to FIG. 23A, the anti-fuse circuit includes a decoupling transistor 104 connected between the electrode node C7 of the capacitor-type anti-fuse 102 and a node 108, an invertor circuit 105 for inverting the signal potential on the node 108 to output a blow instruction signal /BLOW, a p-channel MOS transistor 106 rendered conductive in activation of a control signal /TPM for precharging the node 108 to the level of the power supply voltage Vcc, and an n-channel MOS transistor 107 for selectively discharging the node 108 to the ground vol in accordance with a control signal φPA. Operations of the anti-fuse circuit shown in FIG. 23A are now described with reference to a signal waveform diagram shown in FIG. 23B.

In the programming operation mode, the control signal /TPM is set low and the node 108 is precharged to the level of the power supply voltage Vcc through the MOS transistor 106.

When a programming cycle is started, the control signal /TPM goes high and the MOS transistor 106 is rendered non-conductive. The control signal φPA is set high or low in accordance with an address signal bit Ad to be stored/programmed. The high voltage HV for programming is applied to the electrode node C8.

If the control signal φPA is at a high level, the MOS transistor 107 is rendered conductive, the node 108 is driven to the ground voltage level, a high voltage is applied between the electrode nodes C8 and C7 of the capacitor-type anti-fuse 102, and the capacitor-type anti-fuse 102 is put in a blown state. When the control signal φPA is at a low level, the MOS transistor 107 is in a non-conductive state, the node 108 maintains the level of the power supply voltage Vcc and no high voltage is applied between the electrode nodes C7 and C8 of the capacitor-type anti-fuse 102, and hence the capacitor-type anti-fuse 102 is held in a non-blown state.

Figure 23B:
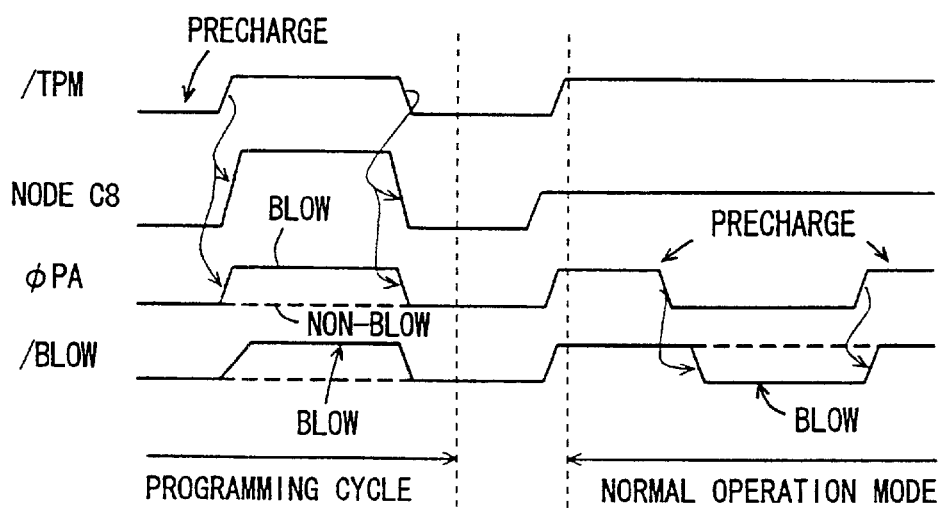
FIG. 23B is a signal waveform diagram representing operations of the circuit shown in FIG. 23A.

When the programming cycle ends in FIG. 23B, the control signal /TPM is set low and the node 108 is precharged to the level of the power supply voltage Vcc.

In the normal operation mode, the control signal /TPM is held at a high level, and the power supply voltage Vcc is applied to the electrode node C8. The control signal φPA serves as an operation cycle defining signal, and changes in synchronization with a memory cycle start instruction signal RAS. In the normal operation mode, therefore, the node 108 is precharged to the ground voltage level in accordance with the control signal φPA, and the blow instruction signal /BLOW from the invertor circuit 105 is set high. When a normal operation cycle (active cycle) is started, the control signal φPA goes low and the MOS transistor 107 is rendered non-conductive. If the anti-fuse 102 is in a conductive state, the power supply voltage Vcc applied to the electrode node C8 is transmitted to the node 108 and the blow instruction signal/BLOW falls to a low level. When the capacitor-type anti-fuse 102 is in a non-blown state, no current flows from the electrode node C8 to the node 108 and hence the node 108 maintains a low level and the blow instruction signal/BLOW maintains a high level. In the normal operation mode, the program state of the antifuse circuit can be read by observing the high/low level of the blow instruction signal/BLOW.

The state of the blow instruction signal/BLOW differs between the programming cycle and the normal operation mode. In the programming cycle, however, only programming of blowing/non-blowing of the capacitor-type anti-fuse 102 is required and no particular problem arises even if the state of the blow instruction signal/BLOW is different from that in the normal operation mode.

Figure 24:
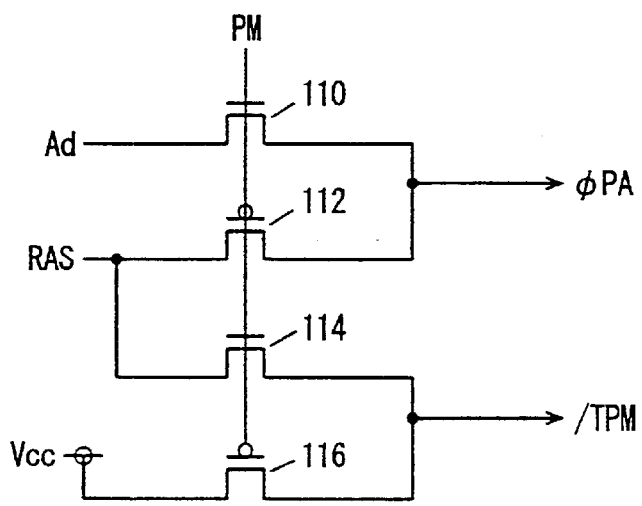
FIG. 24 schematically illustrates the structure of a portion generating control signals shown in FIG. 23A.

FIG. 24 schematically illustrates the structure of a part for generating the control signals shown in FIG. 23A Referring to FIG. 24, the control signal generation part includes an n-channel MOS transistor 110 rendered conductive in activation (high level) of a program mode instruction signal PM for passing the program address signal bit Ad, a p-channel MOS transistor 112 rendered conductive in inactivation of the program mode instruction signal PM for passing the memory cycle start instruction signal RAS, and a p-channel MOS transistor 116 rendered conductive in activation of the program mode instruction signal PM for passing the power supply voltage Vcc. First conduction nodes of the MOS transistors 110 and 112 are coupled together, to output the control signal φPA. First conduction nodes of the MOS transistors 114 and 116 are coupled together, to output the control signal /TPM. Each anti-fuse circuit is provided with MOS transistors 110 and 112. MOS transistors 114 and 116 are provided in common to a plurality of anti-fuse circuits, for transmitting the control signal /TPM to the plurality of anti-fuse circuits in common.

In the programming mode (programming cycle), the control signal φPA is generated in accordance with the program control address signal bit Ad, ana the control signal /TPM is generated in accordance with the memory cycle start instruction signal RAS. In the normal operation mode, the program mode instruction signal PM is at a low level and hence the control signal φPA is generated in accordance with an inverted signal of the memory cycle start instruction signal RAS and the control signal /TPM is fixed at the level of the power supply voltage Vcc.

In the structure of the control signal generation part shown in FIG. 24, the address bit Ad to be stored is a row address signal bit. If the address signal bit Ad to be stored is a column address signal bit, a column selecting operation start instruction signal CAS is employed in place of the memory cycle start instruction signal RAS. The signal RAS can be replaced with an appropriate signal in accordance with the content of the storage information to be programmed.

In order to selectively transmit the high voltage HV and the ground voltage GND to the electrode node C8 shown in FIG. 23A, the structure shown in FIG. 18 can be utilized. The electrode node C8 may be fixedly set at the ground voltage level in a bonding step before packaging or the like.

When the ratio of the resistance value of the anti-fuse 102 in a blown state to the channel resistance of the MOS transistor 107 is such set that a voltage at node 108 is higher than the input logic threshold voltage of the invertor 105 in the general cycle, the signal φPA may be set high in the general cycle (φPA =RAS).

According to the embodiment 6 of the present invention, as hereinabove described, voltages of the same polarity are applied to a capacitor-type anti-fuse in a programming operation mode and in a normal operation mode, whereby the conductive/non-conductive state of the capacitor-type anti-fuse can be readily and reliably confirmed (since the polarity of its breakdown voltage characteristics remains unchanged). Further, the capacitor-type anti-fuse can be readily blown by performing programming in a direction providing a low breakdown voltage, and a relatively low voltage can be used as a high voltage for programming.

[Embodiment 7]

Figure 25A:
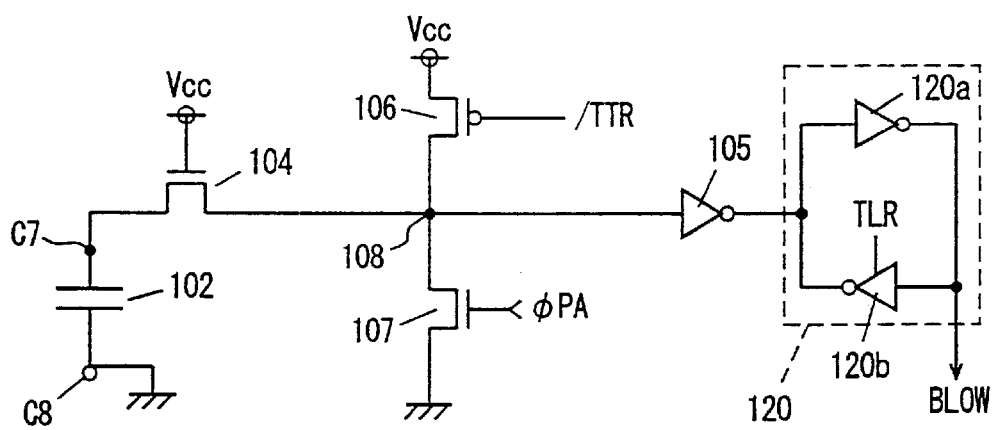
FIG. 25A schematically illustrates the structure of an anti-fuse circuit according to an embodiment 7 of the present invention.

FIG. 25A schematically illustrates the structure of an anti-fuse circuit according to an embodiment 7 of the present invention. In the structure of the anti-fuse circuit shown in FIG. 25A, an invertor circuit 105 is provided at its output with a latch circuit 120 for latching an output signal of the invertor circuit 105 in response to activation of a latch trigger instruction signal TLR. A node of a p-channel transistor 106 for precharging a node 108 is supplied with a trigger signal /TTR activated in the form of a one-shot pulse in starting of a memory cycle. A node C8 is at the level of a ground voltage. The remaining structure of this anti-fuse circuit is identical to that shown in FIG. 23A, and corresponding parts are denoted by the same reference numerals.

The latch circuit 120 includes an invertor 120a for inverting the output signal of the invertor circuit 105 to output a blow instruction signal BLOW and a tri-state invertor 120b rendered operative in activation of the latch trigger instruction signal TLR for inverting the output signal of the invertor 120a and transmitting the inverted signal to an input of the invertor 120a. Operations of the anti-fuse circuit shown in FIG. 25A are now described with reference to an operation waveform diagram shown in FIG. 25B.

In a programming operation, operations similar to those shown in FIG. 23B are performed. In a normal operation, a stored information read cycle (memory cycle) start instruction signal /RAS defines an operation cycle of the anti-fuse circuit.

In a standby state, the memory cycle start instruction signal /RAS is in an inactive state of a high level, a control signal φPA is at a high level, the trigger signal /TTR is at a high level, and the latch trigger instruction signal TLR is at a low level. In this state, the node 108 is discharged to the ground voltage level through a MOS transistor 107, and the blow instruction signal BLOW is also held at a low level.

When a read (memory) cycle is started, the control signal φPA enters an inactive state of a low level and then the trigger signal /TTR is set low for a prescribed period. Thus, the node 108 is charged to the level of a power supply voltage Vcc through MOS transistor 106. When capacitor-type anti-fuse 102 is blown, the charge voltage for the node 108 is discharged to the electrode node C8 receiving the ground voltage through the capacitor-type anti-fuse 102.

When the capacitor-type anti-fuse 102 is non-blown, no path for feeding a current is present and hence the node 108 is held at the level of the power supply voltage Vcc. When the node 108 has the charging operation completed and the voltage level thereof is stabilized, the latch trigger instruction signal TLR is activated, the tri-state invertor 120b operates and the latch circuit 120 inverts and latches the output signal of the invertor circuit 105. Thus, the blow instruction signal BLOW is held at a low level similarly to the standby state when the capacitor-type anti-fuse 102 is blown, while the blow instruction signal BLOW is driven to a high level when the capacitor-type anti-fuse 102 is non-blown. When the memory cycle is completed, the memory cycle start instruction signal /RAS is driven to a high level, and the control signal φPA responsively goes high again while the latch trigger instruction signal TLR goes low. Thus, the node 108 is discharged to the ground voltage level. The blow instruction signal BLOW returns to a low level.

When the node 108 is charged in the form of a one-shot pulse to the level of the power supply voltage Vcc as shown in FIG. 25A, the power supply voltage Vcc is applied between an electrode node C7 and the electrode node C8 of the non-blown capacitor-type anti-fuse 102 only for a short period. Thus, voltage stress on the capacitor-type anti-fuse 102 can be relaxed with no continuous application of the power supply voltage Vcc during the memory cycle, deterioration of the insulation property of the non-blown capacitor-type anti-fuse 102 can be prevented, and a highly reliable programming circuit can be implemented.

In the structure shown in FIG. 25A, the blow instruction signal BLOW may alternatively be extracted from the output of the invertor circuit 105.

The control signal φPA for instructing precharging may be activated after the latch circuit 120 enters a latch state. This is readily implemented by rendering the driving capability of the tri-state invertor 120b larger than that of the invertor circuit 105. In this structure, the invertor circuit 105 may be activated/inactivated complementarily with the tri-state invertor 120b in response to the latch trigger instruction signal TLR.

According to this structure, the period for applying the power supply voltage Vcc between the electrode nodes C7 and C8 of the non-blown capacitor-type anti-fuse 102 can be reduced. In the standby cycle, the inter-electrode voltage of the capacitor-type anti-fuse 102 is 0 V and voltage stress applied to the capacitor-type anti-fuse 102 can be remarkably relaxed.

Figure 25B:
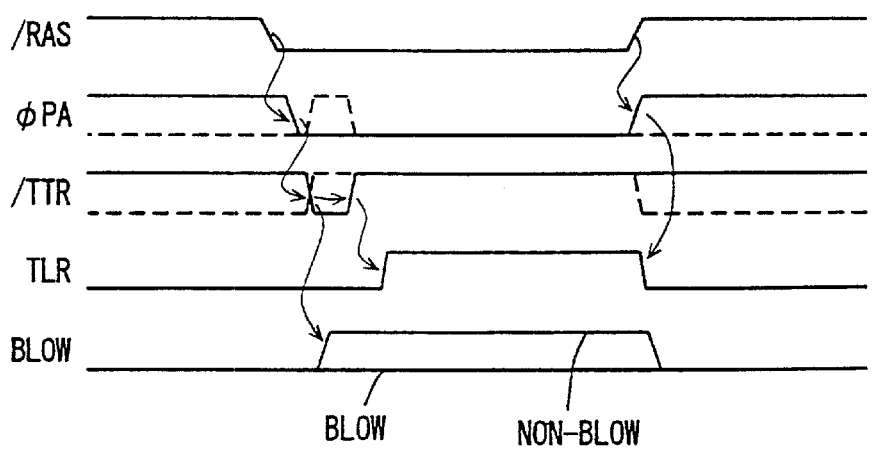
FIG. 25B is a signal waveform diagram representing operations of the circuit shown in FIG. 25A.

In the structure shown in FIG. 25A, the power supply voltage Vcc may be applied to the electrode node C8 and the precharge voltage for the node 108 may be reversed in the standby cycle and a normal memory cycle, as shown by broken lines in FIG. 25B (operation sequence of high-level precharging, one-shot low-level precharging and determination of blowing /non-blowing). In the standby state, the signal /TTR is at a low level and the node 108 is precharged to the level of the power supply voltage Vcc. The inter-electrode voltage of the anti-fuse 102 is 0 V. In an active cycle, the signal /TTR is set high, the signal φPA is driven to a high level in the form of a one-shot pulse, and the node 108 is discharged to the ground voltage level.

Figure 26:
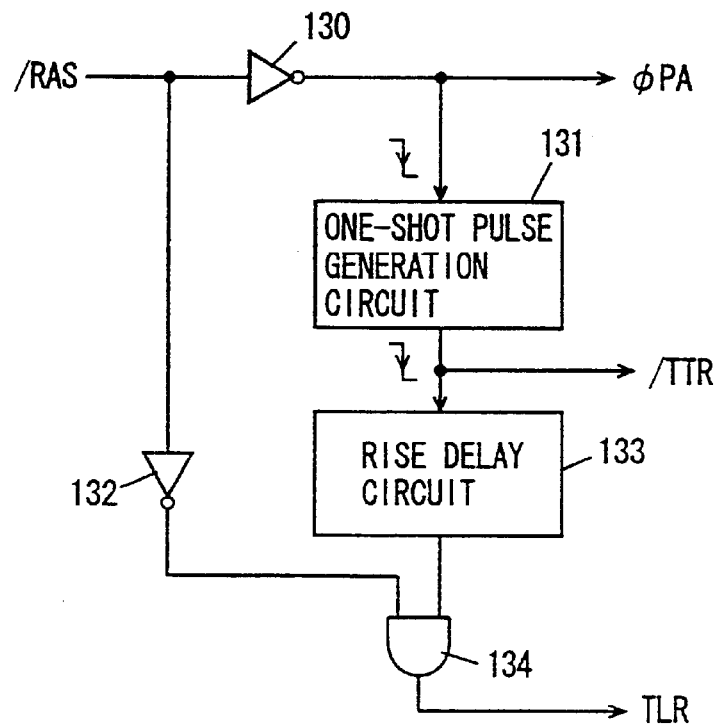
FIG. 26 Schematically illustrates the structure of a control signal generation portion shown in FIG. 25A.

FIG. 26 schematically illustrates the structure of a part for generating the control signals shown in FIG. 25A. Referring to FIG. 26, the control signal generation part includes a buffer circuit 130 for buffering the memory cycle start instruction signal /RAS to generate the control signal φPA instructing precharging, a one-shot pulse generation circuit 130 for outputting the trigger signal /TTR going low for a prescribed period in response to fall of the output signal from the buffer circuit 130, a rise delay circuit 133 for delaying a rise of the trigger signal /TTR outputted from the one-shot pulse generation circuit 131, an invertor 132 receiving the memory cycle start instruction signal /RAS, and an AND circuit 134 receiving an output signal from the invertor 132 and that from the rise delay circuit 133 to output the latch trigger instruction signal TLR.

When the memory cycle start instruction signal /RAS enters an active state of a low level the control signal φPA for instructing precharging enters an inactive state of a low level. In response to this inactivation of the control signal φPA for instructing precharging, the one-shot pulse generation circuit 131 generates a one-shot pulse signal attaining a low level for a prescribed period. The output signal from the one-shot pulse generation circuit 131 is employed as the trigger signal /TTR. Thus, the node 108 is precharged to the level of the power supply voltage Vcc for a prescribed period. After a lapse of a prescribed period from completion of the precharge operation, the output signal from the rise delay circuit 133 rises to a high level. On the other hand, the output signal of the invertor 132 goes high in response to activation of the memory cycle start instruction signal /RAS. Therefore, the AND circuit 134 activates the latch trigger instruction signal TLR after the precharge operation to the level of the power supply voltage Vcc is completed and the voltage level of a determination node (the node 108) is stabilized, and this state is held during the active state of the memory cycle start instruction signal /RAS.

The node 108 can be precharged to the ground voltage level after activation of the latch trigger instruction signal TLR by appropriately modifying the structure of the control signal generation part shown in FIG. 26 (activation of the precharge instruction signal φPA). This is implemented by employing a signal obtained by ORing the precharge instruction signal φPA and an inverted signal of the latch trigger instruction signal TLR in the structure shown in FIG. 26 as a signal instructing precharging to the ground voltage level. Further, the broken line waveform sequence shown in FIG. 25B can also be readily implemented.

According to the embodiment 7 of the present invention, as hereinabove described, a power supply voltage is applied to a capacitor-type anti-fuse in the form of a one-shot pulse in a normal operation mode, whereby voltage stress applied to the capacitor-type anti-fuse in a nonblown state can be remarkably reduced and the capacitor-type anti-fuse can be protected against deterioration of the insulation property.

[Embodiment 8]

Figure 27:
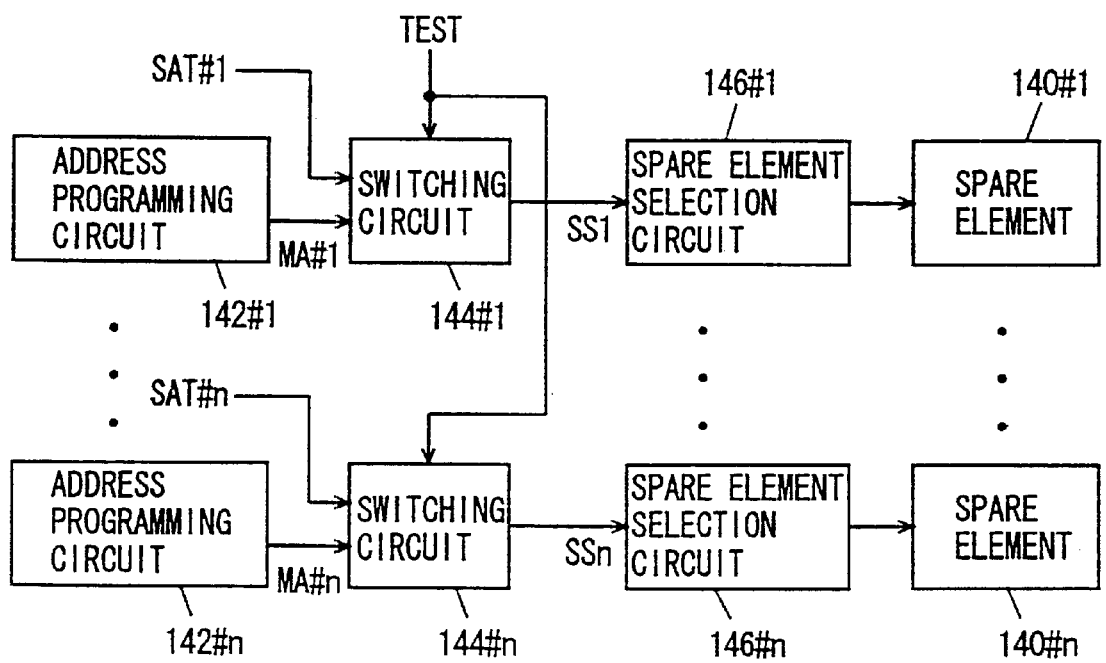
FIG. 27 schematically illustrates the structure of a defect repairing circuit according to an embodiment 8 of the present invention.

FIG. 27 schematically illustrates the structure of a principal part of a semiconductor memory device according to an embodiment 8 of the present invention. Referring to FIG. 27, the semiconductor memory device includes spare elements 140#1 to 140#n for repairing a defective element and address programming circuits 142#1 to 142#n provided in correspondence to the spare elements 140#1 to 140#n respectively. Each of the address programming circuits 142#1 to 142#n includes an anti-fuse circuit and a compare/determination circuit. Each of the spare elements 140#1 to 140#n is a spare row for repairing a defective row or a spare column for repairing a defective column.

In correspondence to the respective address programming circuits 142#1 to 142#n, switching circuits 144#1 to 144#n for selectively passing either spare activation signals SAT#1 to SAT#n or output signals MA#1 to MA#n of the corresponding address programming circuits 142#1 to 142#n respectively in accordance with a test mode instruction signal TEST, and spare element selection circuits 146#1 to 146#n for driving the corresponding spare elements 140#1 to 140#n to selected states in accordance with output signals SS1 to SSn of the switching circuits 144#1 to 144#n are provided.

The test mode instruction signal TEST is activated in a detection operation of defectiveness/non-defectiveness of the spare elements 140#1 to 140#n or the address programming circuits 142#1 to 142#n of this defect rep ailing circuit. The spare activation signals SAT#1 to SAT#n are supplied from an external device (tester) or internally generated using a counter or the like in a test operation mode.

In the defect repairing circuit shown in FIG. 27, the address programming circuit 142#1 performs defective address programming. The defect repairing circuit determines whether or not the spare element 140#1 normally operates. If the spare element 140#1 is defective, the defect repairing circuit stops employment of this spare element 140#1 and employs another spare element and address programming circuit. Even if the spare element 140#1 normally operates, the address programming circuit 142#1 is not employed if defective (when a capacitor-type anti-fuse is defective, for example). Therefore, a set of a plurality of address programming circuits and a plurality of spare elements can be prepared for a single defective element (normal cell row or normal cell column). Thus, a spare element can be further repaired in a redundantly structure, whereby the chip yield can be improved.

Figure 28:
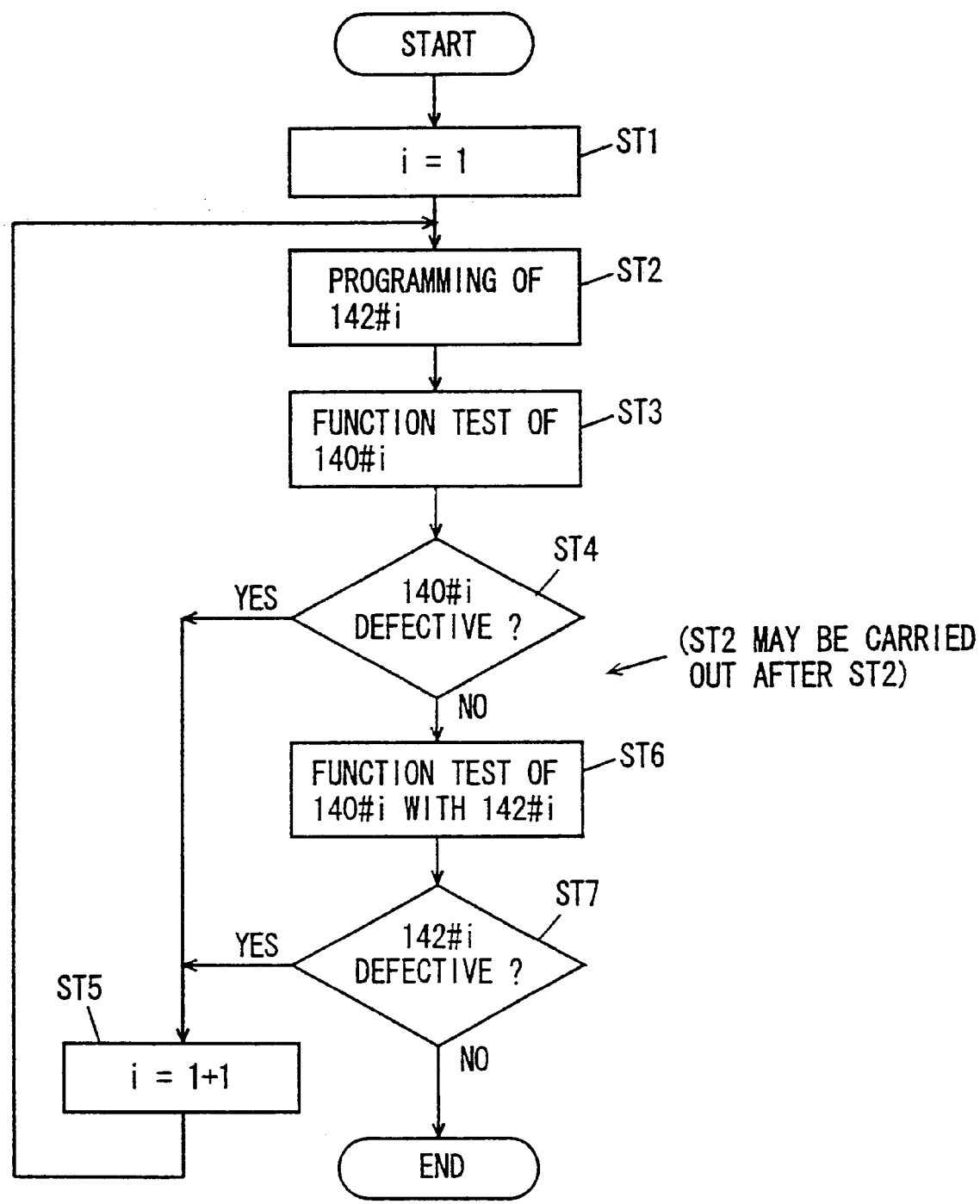
FIG. 28 is a flow chart showing a programming procedure in the structure shown in FIG. 27.

FIG. 28 is a flow chart showing a programming operation of the defect repairing circuit shown in FIG. 27. The programming sequence of the defect repairing circuit shown in FIG. 27 is now described with reference to FIG. 28.

First, the defect repairing circuit specifies the first spare element 140#1 and the corresponding address programming circuit 142#1 (i is set at 1) (step ST1). The defect repairing circuit programs a defective address to be repaired into the address programming circuit 142#i (step ST2). Then, the defect repairing circuit activates the test mode instruction signal TEST for making the switching circuit 144#i select the spare activation signal SAT#i to activate the spare element 140#i corresponding to the spare element selection circuit 146#i. The defect repairing circuit performs a function test (short circuit or the like) of the activated spare element 140#i, and determines whether or not the spare element 140#i is defective (steps ST3 and ST4). When the result of the function test for the spare element 140#i indicates defectiveness, the process advances to a step ST5. The address programming circuit 142#i and the spare element 140#i are unemployable. Therefore, the defect repairing circuit increments i by one and performs programming for the next address programming circuit 142#i+1. When the spare element 140#i is normal, on the other hand, the defect repairing circuit supplies an address signal to the address programming circuit 142#i, selects the spare element 140#i and performs a function test on the spare element 140#i (step ST6).

In this case, the defect repairing circuit has only to simply determine whether or not the spare element 140#i is driven to a selected state since the spare element 140#i normally operates, and hence the defectiveness/non-defectiveness can be identified by writing/reading data. When the result of the function test at the step ST6 indicates presence of defectiveness, the address programming circuit 142#i is defective. When the address programming circuit 142#i is determined to be defective at a defectiveness determination step ST7, the defect repairing circuit increments i by one at the step ST5, performs programming for the next address programming circuit 142#i +1, and repetitively executes the operations of the step ST2 and the following steps.

When the result of the determination at the step ST7 indicates normality, the address programming circuit 142#i and the spare element 140#i normally operate and hence address programming is so normally performed that a defective element can be reliably repaired even in a normal operation mode. This operation is executed for each defective address.

The defect repairing circuit may alternatively program the corresponding address programming circuit 142#i when the steps ST1, ST3 and ST4 are completed, normality/abnormality of the spare element 140#i is determined in accordance with the spare activation signal SAT#i, and the spare element 140#i is determined to be normal.

Figure 29:
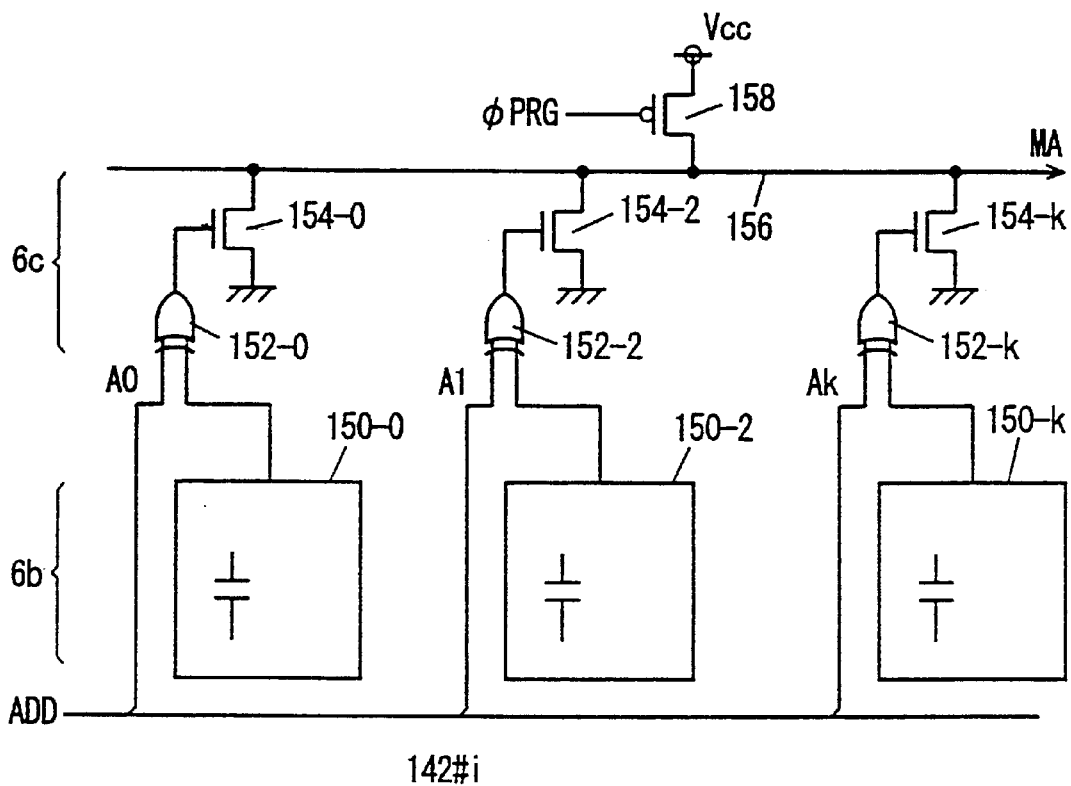
FIG. 29 schematically illustrates the structure of an address programming circuit shown in FIG. 27.

FIG. 29 schematically illustrates the structure of each of the address programming circuits 142#1 to 142#n shown in FIG. 27. This FIG. 29 representatively shows the structure of the address programming circuit 142#i.

Referring to FIG. 29, the address programming circuit 142#i includes anti-fuse circuits 150-0 to 150-k provided in correspondence to address signal bits A0 to Ak respectively, mismatch detection circuits 152-0 to 152-k provided in correspondence to the address signal bits A0 to Ak respectively for receiving the address signal bits A0 to Ak and output signals of the corresponding anti-fuse circuits 150-0 to 150-k, n-channel MOS transistors 154-0 to 154-k coupled in parallel to an output signal line 156 for receiving output signals from the mismatch detection circuits 152-0 to 152-k of their gates, and a precharge circuit 158 formed by a p-channel MOS transistor for precharging the output signal line 156 to the level of a power supply voltage Vcc in accordance with a precharge instruction signal φPRG.

Each of the anti-fuse circuits 150-0 to 150-k includes a capacitor-type anti-fuse for programming the corresponding address signal bit by blowing/non-blowing of the capacitor-type anti-fuse. In a normal operation mode, a signal (BLOW or /BLOW) indicating blowing/nonblowing is outputted. Operations of the address programming circuit 142#i shown in FIG. 29 are now described.

When an address signal ADD is supplied, the address signal bits A0 to Ak are supplied to first inputs of the mismatch detection circuits 152-0 to 152-k respectively. The anti-fuse circuits 150-0 to 150-k output signals in accordance with the states of the respective capacitor-type anti-fuses. When the output signal pattern from the anti-fuse circuits 150-0 to 150-k match with the address signal bit pattern A0 to Ak, all output signals from the mismatch detection circuits 152-0 to 152-k go low, the MOS transistors 154-0 to 154-k are in non-conductive states, and a signal MA from the output signal line 156 is held at a high level.

If any mismatch is present, at least one of the output signals from the mismatch detection circuits 150-0 to 150-k goes high. In response, at least one of the MOS transistors 154-0 to 154-k is rendered conductive, the output signal line 156 is discharged to the level of a ground voltage, and the signal MA goes low. When the signal MA is at a high level, a defective address is addressed and hence the corresponding spare element is activated for rep airing the defective address.

The anti-fuse circuits 150-0 to 150-k have only to be so structured that the output signals thereof match with the bits respective of the defective address, and any of the aforementioned embodiments is employable.

Figure 30:
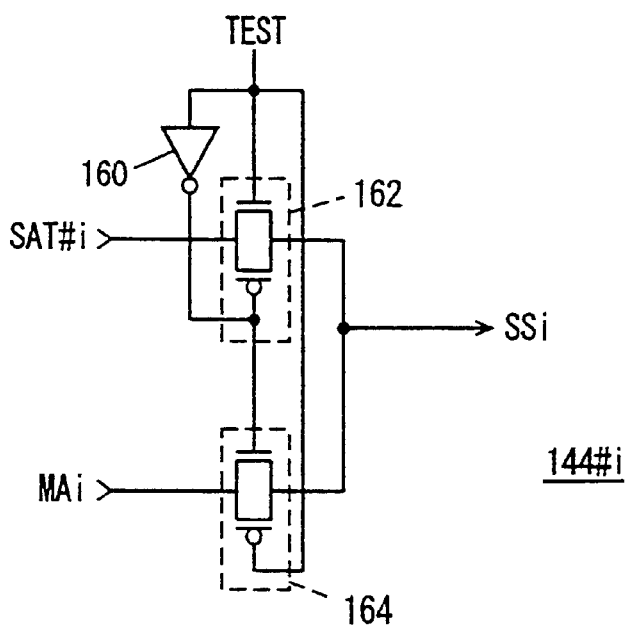
FIG. 30 illustrates an exemplary structure of a switching circuit shown in FIG. 27.

FIG. 30 illustrates an exemplary structure of each switching circuit shown in FIG. 27. Referring to FIG. 30, the switching circuit 144#i (144#1 to 144#n) includes an invertor 160 for inverting the test mode instruction signal TEST, a CMOS transmission gate 162 rendered conductive in response to the test mode instruction signal TEST and an output signal of the invertor 160 for passing the spare activation signal SAT#i, and a CMOS transmission gate 164 rendered conductive complementarily with the CMOS transmission gate 162 in response to the test mode instruction signal TESTand the output signal of the invertor 160 for passing the output signal MAi from the corresponding address programming circuit 142#i. Output signals from the CMOS transmission gates 162 and 164 are supplied to the spare element selection circuit 146#i as a spare selection signal SSi.

In the structure shown in FIG. 30, the CMOS transmission gates 162 and 164 select either the externally or internally generated test spare activation signal SAT#i or the output signal MAi from the corresponding address programming circuit 142#i and transmit the selected one to the spare element selection circuit 146#i. Thus, a signal path for a signal driving the spare element selection circuit 146#i can be switched depending on the operation mode.

Figure 31A:
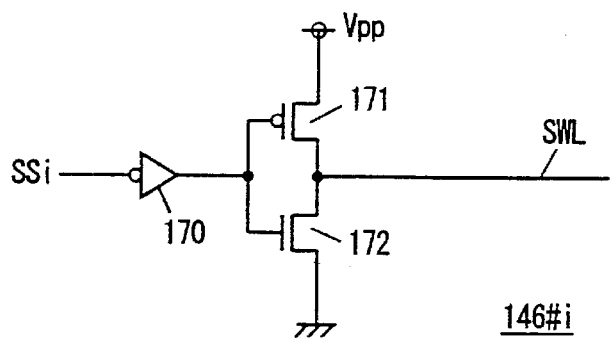
FIGS. 31A and 31B illustrate exemplary structures of a spare element selection circuit shown in FIG. 27 respectively.

FIG. 31A illustrates an exemplary structure of each of the spare element selection circuits 146#1 to 146#n shown in FIG. 27. This FIG. 31A shows the structure of the spare element selection circuit 146#i with the spare element 140#i forming a spare word line SWL.

Referring to FIG. 31A, the spare element selection circuit 146#i includes an invertor circuit 170 receiving a spare element activation signal SSi supplied from the corresponding switching circuit 144#i, a p-channel MOS transistor 171 connected between a high voltage node and the spare word line SWL and rendered conductive when the invertor circuit 170 outputs a low-level signal, for charging the spare word line SWL to the level of a high voltage Vpp, and an n-channel MOS transistor 172 rendered conductive, when the invertor circuit 170 outputs a high-level signal, for discharging the spare word line SWL to the ground voltage level. The spare word line SWL is driven to the level of the high voltage Vpp in a selected state.

When match is detected in the corresponding address programming circuit 142#i, the output signal MAi from the corresponding address programming circuit 142#i is at a high level. Therefore, the output signal of the invertor 170 goes low for driving the spare word line SWL to a selected state. Thus, defect is repaired by redundancy replacement.

The invertor circuit 170 may have a level conversion function, while the so-called "half latch" word line-drive circuit provided with a p-channel MOS transistor for charging an output of the invertor circuit 170 to the level of the high voltage Vpp may be employed. The spare element selection circuit 146#i can have an arbitrary structure. The spare word line SWL may have a hierarchical structure, and a spare decoder may be provided for driving a spare subword line included in a plurality of spare word lines to a selected state.

The spare element selection circuit 146#i is merely required to drive the corresponding spare element 140#i to a selected state in accordance with a match detection signal from the corresponding address programming circuit 142#i.

Figure 31B:
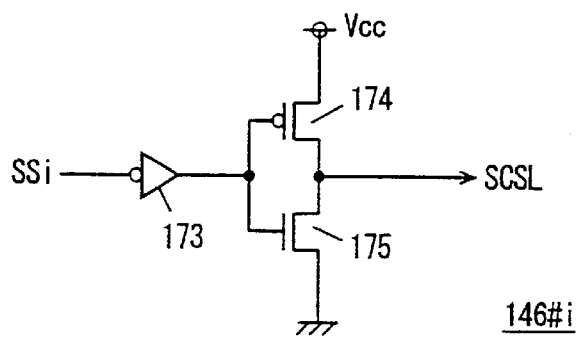

FIG. 31B illustrates another exemplary structure of the spare element selection circuit 146#i. Referring to FIG. 31B, the spare element 140#i is a spare memory cell column.

Referring to FIG. 31B, the spare element selection circuit 146#i includes an invertor circuit 173 receiving a spare selection signal SSi, and a CMOS invertor receiving the power supply voltage Vcc and the ground voltage as operation power supply voltages to operate for inverting an output signal of the invertor 173 to output a spare column selection signal SCSL. The CMOS invertor includes a p-channel MOS transistor 174 and an n-channel MOS transistor 175 serially connected between a power supply node and a ground node and receiving the output signal of the invertor circuit 173 on their gates.

In the structure shown in FIG. 31B, the output signal of the invertor 173 goes low when the spare selection signal SSi is at a high level (the match detection signal MAi is at a high level), and the spare column selection signal SCSL is responsively driven to a high level. Thus, a defective column is repaired by replacement with a spare column.

When the spare selection signal SSi is at a low level, the spare column selection signal SCSL is at a low level and no redundancy replacement is performed.

Figure 32:
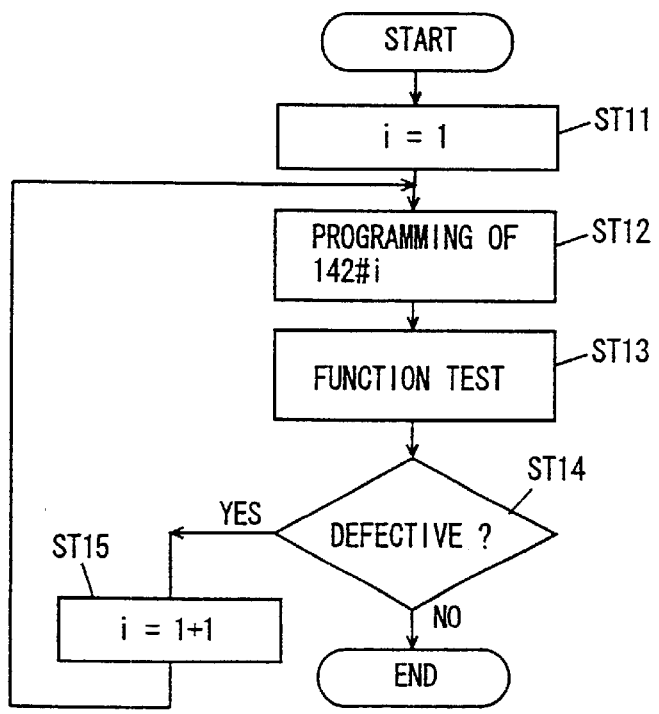
FIG. 32 is a flow chart showing operations of a modification of the embodiment 8 of the present invention.

[Modification]FIG. 32 is a flow chart showing operations of a modification of the embodiment 8 of the present invention. The operations of the modification of the embodiment 8 of the present invention are now described with reference to the flow chart shown in FIG. 32.

In this modification, an address programming circuit 142#i is provided for each spare element 140#i. A spare selection circuit is also provided for each spare element 140#i, while no switching circuit is provided.

First, initialization is performed (i is set at 1) (step ST11). Then, a defective address is programmed into the address programming circuit 142#i (step ST12). Then, the address programming circuit 142#i is operated, the corresponding spare element 140#i is driven to a selected state, and a function test is done on the spare element 140#i (step ST13).

On the basis of the function test, a determination is made at a step ST14 as to whether or not defectiveness is present in the spare element 140#i. If the determination result is of YES, at least one the address programming circuit 142#i and the spare element 140#i is defective. In this case, the address programming circuit 142#i and the spare element 140#i are not employed but i is incremented by one for selecting the next set of address programming circuit and spare element (step ST15). Then, the processing of the step ST12 et seq. is performed again.

If a determination of normality is made at the step ST14, the address programming circuit 142#i and the spare element 140#i normally function and hence the defective address programming operation is completed. Then, a next defective address is programmed. When all defective addresses are completely programmed, the programming for defect repairing is completed.

In the procedure of this modification, no switching circuit is utilized with the test mode instruction signal TEST. Defectiveness/non-defectiveness of a set of the address programming circuit 142#i and the spare element 140#i is simply determined for replacing a defective set with another set of address programming circuit and spare element. Thus, the time required for programming can be reduced According to the embodiment 8 of the present invention, as herein above described, a defect repairing circuit for repairing a defective element has a redundant structure, whereby program failure caused by a defective capacitor-type anti-fuse, for example, can be replaced with another address programming circuit for preventing reduction of the chip yield.

In the embodiment 8, a capacitor-type anti-fuse employed for an anti-fuse circuit is preferably formed by a capacitance element having the same structure as a memory cell capacitor or transistor. However, the embodiment 8 is applicable also to a capacitor-type anti-fuse formed by a general capacitor or MOS capacitor.

[Embodiment 9]

Figure 33:
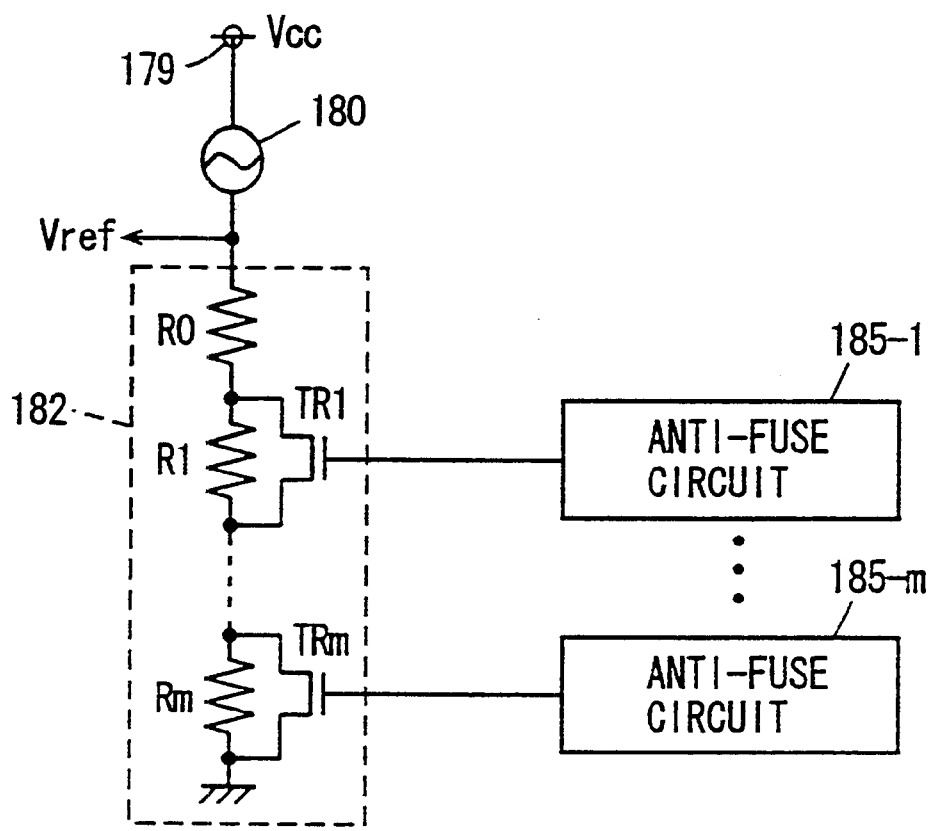
FIG. 33, schematically illustrates the structure of a semiconductor device according to an embodiment 9 of the present invention.

FIG. 33 illustrates the structure of a principal part of a semiconductor device according to an embodiment 9 of the present invention. Referring to FIG. 33, the semiconductor device includes a constant current source 180 for supplying a constant current from a power supply node 179, a programmable resistance circuit 182 for converting the current from the constant current source 180 to a voltage to generate a reference voltage Vref, and anti-fuse circuits 185-1 to 185-m for adjusting the resistance value of the programmable resistance circuit 182. The programmable resistance circuit 182 includes resistive elements R0 to Rm serially connected between an output node and a ground node and n-channel MOS transistors TR1 to TRm provided in parallel with the resistive elements R1 to Rm respectively for receiving output signals of the anti-fuse circuits 185-1 to 185-m in respective gates.

Each of the anti-fuse circuits 185-1 to 185-m has a capacitor-type anti-fuse similar to those according to the embodiments 1 to 7, and programs the capacitor-type anti-fuse through a conductive/non-conductive state of the corresponding transistor.

If the number of those of the transistors TR1 to TRm rendered conductive is reduced, the resistance value of the programmable resistance circuit 182 is increased to raise the level of the reference voltage Vref. If the number of those of the transistors TR1 to TRm rendered conductive is reduced, the resistance value of the programmable resistance circuit 182 is reduced to lower the level of the reference voltage Vref. Therefore, the resistance value of the programmable resistance circuit 182 can be adjusted by programming the capacitor-type anti-fuses included in the anti-fuse circuits 185-1 to 185-m for generating the reference voltage Vref of the optimum level.

When the anti-fuse circuits 185-1 to 185- are utilized, any of the transistors TR1 to TRm to be rendered non-conductive can be equivalently programmed by applying an appropriate switching signal (AD) to the anti-fuse circuits 185-1 to 185-m in a test mode. The anti-fuse circuits 185-1 to 185-m are programmed on the basis of data obtained in the test mode. In the optimizing the resistance value of the programmable resistance circuit 182, the control signal can be generated from the anti-fuse circuits 185-1 to 185-m in the test operation mode by rendering the capacitor-type anti-fuses non-conductive without applying a high voltage and by setting the output signals of the anti-fuse circuits 185-1 to 185-m through the switching signals (AD). In programming, a high voltage is applied and a signal pattern corresponding to its optimum value is applied to the anti-fuse circuits 185-1 to 185-m Thus, the anti-fuse circuits 185-1 to 185-m can be utilized both in the test operation mode and in a programming operation mode, simplifying the circuit structure.

Figure 34:
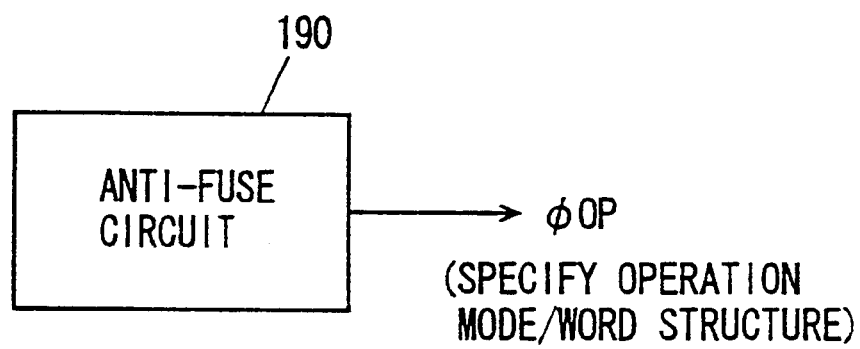
FIG. 34 shows a structure of a modification of the embodiment 9.
Figure 35:
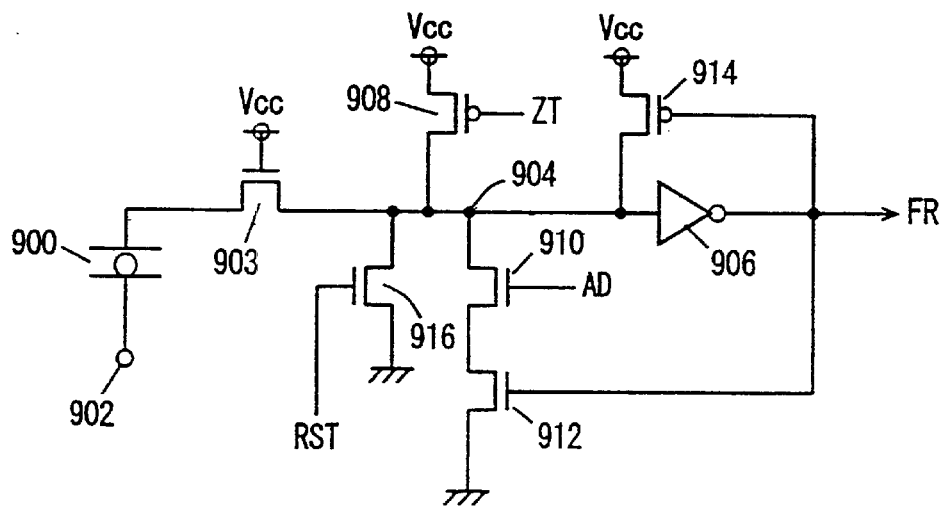
FIG. 35 illustrates an exemplary structure of a conventional anti-fuse circuit.

[Modification]FIG. 34 illustrates the structure of a modification of the embodiment 9 of the present invention. Referring to FIG. 34, an output signal #1 from an anti-fuse circuit 190 is employed as an operation mode specification signal. An operation mode of a semiconductor device is specified in accordance with the signal #1. This signal #1 may be employed for setting a word configuration (data bit number). The so-called "bonding option" function of the word configuration, the operation mode and the like generally set by bonding or mask interconnection line can be set in accordance with the output signal #1 of the anti-fuse circuit 190. In this case, no pad is necessary for switching the mode or the word configuration.

The anti-fuse circuit 190 can replace a fuse element employed in a laser trimming step performing blowing/non-blowing with a laser beam or the like in general. In this case, a combination of the anti-fuse circuit 190 and a switching transistor rendered conductive/non-conductive in response to its output signal replaces a fuse element.

[Other Applications]

When a memory cell capacitor is employed, this memory cell capacitor is only required to have a three-dimensional structure. A stacked capacitor may have any of cylindrical, T-shaped and fin structures. The present invention is also applicable to a trench capacitor.

For a MOS capacitor structure utilizing no memory cell capacitor in particular, the present invention is applicable to any MOSIC.

According to the present invention, as hereinabove described, a plurality of capacitance elements having the same structure as memory cell capacitors are coupled in parallel with each other to form a capacitor-type anti-fuse, whereby a capacitor-type anti-fuse having desired characteristics can be correctly formed even in a peripheral circuit region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of memory cells arranged in rows and columns, each of the memory cells having a capacitor for storing information;
   a programming element having a plurality of capacitance elements arranged in at least one of row and column directions and coupled in parallel with each other, the capacitance element being the same in structure as the capacitor of the memory cell; and
   a program control circuit for programming said programming element by dielectric breakdown of said plurality of capacitance elements.

2. The semiconductor device in accordance with claim 1, wherein
   each of said plurality of memory cells further includes an access transistor for reading information from a corresponding capacitor, and
   said programming element includes a plurality of replica transistors serially connected with said plurality of capacitance elements respectively and each having a same structure as said access transistor, said plurality of replica transistors are normally set in a conductive state and said plurality of capacitance elements are connected in parallel with each other through the replica transistors.

3. The semiconductor device in accordance with claim 2, wherein said plurality of capacitance elements and said plurality of replica transistors are so arranged that unit cells each comprised of a capacitance element and a replica transistor are aligned along the row direction, and
   said programming element further includes:
       a control line arranged along said row direction and coupled to gates of said plurality of replica transistors in common,
       a first electrode line coupled to first electrode nodes of said plurality of replica transistors in common for forming a one electrode of said programming element, and
       a second electrode line coupled to first electrodes of said plurality of capacitance elements in common for forming another electrode of said programming element, second electrodes of said plurality of capacitance elements being connected to second electrode nodes of respective replica transistors.

4. The semiconductor device in accordance with claim 2, wherein said plurality of capacitance elements and said plurality of replica transistors are so arranged that unit cells each comprised of a capacitance element and a replica transistor are aligned along the column direction, and said programming element further includes:
  a first line aligned along said column direction and coupled to first electrode nodes of said plurality of replica transistors in common for forming one electrode of said programming element,
  a control line transmitting a voltage for setting said plurality of replica transistors in a conductive state to gates of said plurality of replica transistors, and
  a second electrode line coupled to first electrodes of said plurality of capacitance elements in common for forming another electrode of said programming element, second electrodes of said plurality of capacitance elements begin connected to second electrode nodes of respective replica transistors.

5. The semiconductor device in accordance with claim 1, wherein said programming element further includes a semiconductor substrate region of a first conductivity type arranged in common to said plurality of capacitance elements, each of said plurality of capacitance elements has an impurity region of said first conductivity type formed on a surface of said semiconductor substrate region, a first conductor layer connected to said impurity region and formed on said semiconductor substrate region, and a second conductor layer formed above and facing to said first conductor layer, and
  said second conductor layer is provided in common to said plurality of capacitance elements and serving as a firs t electrode of said programming element, and said semiconductor substrate region serves as a second electrode of said programming element.

6. The semiconductor device in accordance with claim 2, wherein said plurality of replica transistors are employed in said program control circuit as a decoupling transistor for preventing transmission of a high voltage in a programming operation mode of said programming element.

7. The semiconductor device in accordance with claim 1, wherein each of said plurality of capacitance elements has a storage node and a cell plate node facing to said storage node with an insulation film placed therebetween, said cell plate node is electrically connected to an upper-layer line through a contact hole formed in a portion facing to said storage node, said upper layer line is coupled in common to said plurality of capacitance elements, and the storage nodes of the capacitance elements are electrically connected together.

8. The semiconductor device in accordance with claim 1, wherein said plurality of capacitance elements are grouped into a first programming capacitance element and a second programming capacitance element, and
  said program control circuit includes a circuit for serially connecting the first and second programming capacitance elements with each other in a normal operation mode and for connecting said first and second programming capacitance elements in parallel with each other in a programming operation mode.

9. A semiconductor device comprising:
  a capacitor formed by an insulated gate field effect transistor having a gate, and first and second impurity regions formed spacedly on a surface of a substrate region and connected with each other, said gate electrically connected with an upper layer conductive line through a contact hole formed on a channel region between the first and second impurity regions, said first and second impurity regions providing a first electrode of said capacitor and said conductive line providing a second electrode of said capacitor; and
  a program control circuit for applying a programming voltage between the first and second electrodes of said capacitor in a programming operation mode.

10. The semiconductor device in accordance with claim 9, wherein said first and second impurity regions of said capacitor are the same in conductivity type as said substrate region.

11. A semiconductor device comprising:
  a plurality of memory cells each having a capacitor for storing information;
  a programming element having a first programming capacitance element including a first capacitance element having a same structure as the memory cell capacitor and a second programming capacitance element including a second capacitance element having a same structure as the memory cell capacitor; and
  a program control circuit for serially connecting the first and second programming capacitance elements between first and second electrodes of said programming element in a normal operation mode and for connecting said first and second programming elements in parallel between said first and second electrodes in a programming operation mode.

12. A semiconductor device comprising:
  a programming capacitance element having first and second electrode nodes, and having a high breakdown voltage and a low breakdown voltage in accordance with a polarity of an applied between said first and second electrode nodes; and
  a program control circuit for applying a programming voltage across said programming capacitance element with a voltage polarity providing said high breakdown voltage to program said programming capacitance element in a programming operation mode, and for applying a voltage of a voltage polarity providing said low breakdown voltage across said programming capacitance element in a normal operation mode.

13. A semiconductor device comprising:
  a programming capacitance element having first and second electrode nodes; and
  a program control circuit for applying a programming voltage between said first and second electrode nodes with a same voltage polarity in a programming operation mode and in a normal operation mode.

14. A semiconductor device comprising:
  a programming element having a first programming capacitance element including a first capacitance element and a second programming capacitance element including a second capacitance element; and
  a program control circuit for serially connecting the first and second programming capacitance elements between first and second electrodes of said programming element in a normal operation mode and for connecting said first and second programming capacitance elements in parallel between said first and second electrodes in a programming operation mode.

* * * * *